(12) United States Patent
White et al.

(10) Patent No.: US 7,068,124 B2
(45) Date of Patent: *Jun. 27, 2006

(54) INTEGRATED PASSIVE DEVICES FABRICATED UTILIZING MULTI-LAYER, ORGANIC LAMINATES

(75) Inventors: George E. White, Marietta, GA (US); Madhavan Swaminathan, Marietta, GA (US); Venkatesh Sundaram, Norcross, GA (US); Sidharth Dalmia, Alpharetta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/140,630

(22) Filed: May 27, 2005

(65) Prior Publication Data

US 2005/0231304 A1    Oct. 20, 2005

Related U.S. Application Data

(63) Continuation of application No. 10/402,313, filed on Mar. 28, 2003, now Pat. No. 6,900,708.

(51) Int. Cl.
*H03H 7/00*  (2006.01)
(52) U.S. Cl. ...................... 333/185; 333/204
(58) Field of Classification Search ............... 333/185, 333/204
See application file for complete search history.

(56) References Cited

U.S. PATENT DOCUMENTS

| | | | |
|---|---|---|---|
| 4,824,381 A | 4/1989 | Hertzberg et al. ............ 439/87 |
| 5,329,695 A | 7/1994 | Traskos et al. ............... 29/830 |
| 5,401,913 A | 3/1995 | Gerber et al. ............... 174/264 |
| 5,521,564 A * | 5/1996 | Kaneko et al. ............. 333/185 |
| 5,739,193 A | 4/1998 | Walpita et al. ............... 524/413 |
| 6,333,469 B1 | 12/2001 | Inoue et al. ................ 174/260 |
| 6,380,608 B1 | 4/2002 | Bentley ....................... 333/185 |
| 6,583,687 B1 * | 6/2003 | Nosaka ....................... 333/185 |
| 6,586,686 B1 | 7/2003 | Enomoto et al. ........... 174/262 |
| 6,713,162 B1 | 3/2004 | Takaya et al. .............. 257/531 |
| 6,759,600 B1 | 7/2004 | Koyama et al. ............ 174/262 |
| 6,900,708 B1 * | 5/2005 | White et al. ................ 333/185 |
| 2002/0195270 A1 | 12/2002 | Okubora et al. ............ 174/260 |
| 2004/0034489 A1 | 2/2004 | Ogino et al. .................. 702/75 |
| 2004/0113752 A1 | 6/2004 | Schuster ..................... 338/310 |

FOREIGN PATENT DOCUMENTS

| | | |
|---|---|---|
| EP | 1 411 553 A1 | 4/2004 |
| JP | 09-130103 A  * | 5/1997 |
| WO | WO 01/95679 | 12/2001 |

* cited by examiner

*Primary Examiner*—Long Nguyen
(74) *Attorney, Agent, or Firm*—Sutherland Asbill & Brennan LLP

(57) ABSTRACT

The present invention includes an organic device that can be integrated in a multilayer board made of organic material. The passive devices can be integrally fabricated on a circuit board in either surface mount device (SMD) or ball grid array (BGA) form. Alternatively, the passive device can be constructed in a stand alone SMD or BGA/chip scale package (CSP) form to make it mountable on a multilayer board, ceramic carrier or silicon platform in the form of an integrated passive device. The passive device includes side shielding on two sides in the SMD form and four sides in the BGA/CSP form. The side shielding can be external or in-built.

32 Claims, 15 Drawing Sheets

INTEGRATED PASSIVE DEVICES FABRICATED UTILIZING MULTI-LAYER, ORGANIC LAMINATES

CROSS-REFERENCE TO RELATED APPLICATIONS

This application is a continuation of U.S. application Ser. No. 10/402,313, filed Mar. 28, 2003, now U.S. Pat. Ser. No. 6,900,708, which is entirely incorporated herein by reference. In addition, this application is related to the following co-pending, commonly assigned U.S. applications, each of which is entirely incorporated herein by reference: "Methods for Fabricating Three-Dimensional All Organic Interconnect Structures" filed Mar. 28, 2003, and accorded application Ser. No. 10/402,315; and "Stand-Alone Organic-Based Passive Devices" filed Mar. 28, 2003, and accorded application Ser. No. 10/405,024.

STATEMENT OF GOVERNMENT INTEREST

The work that led to this invention has been supported in part by a grant from the U.S. Army, Contract No. DAAH01-99-D-R002-0032. Thus, the United States Government may have certain fights to this invention.

BACKGROUND OF THE INVENTION

I. Field of the Invention

The present invention generally relates to the fabrication of integrated passive devices, and more particularly, to topologies for passive filters fabricated utilizing organic laminates.

II. Description of Related Art

Radio frequency (RF) filters are generally used to remove the out-of-band energy and perform rejection of image-band signals. The design of RF filters in most architectures is becoming a problem since center frequencies are scaling towards the multi-gigahertz range for most RF standards. As the carrier frequency becomes higher, the loaded Q (carrier frequency ÷3 dB bandwidth) for filters becomes higher, which places higher demand on the unloaded quality factor for components such as inductors, capacitors and resonators that make up the filter device.

Coaxial cavity or monoblock type filters have become very popular in commercial applications, especially in portable communication equipments, due to their high performance. Low loss is achieved in such devices with transmission line sections that are rounded, such as coax lines, or by avoiding sharp corners. However, there are several disadvantages to ceramic coaxial cavity or monoblock filters. For example, mold for these filters is expensive and each new design usually needs a new mold. Also, when fabricating coaxial type ceramic filters, different coaxial resonators are sintered and coated separately, and then connected to each other by soldering the connecting wires by hand. Yet further, such filters are typically fastened to some mounting support in a mechanically reliable manner, which adds to the difficulty and cost of the manufacturing process. Lastly, size reduction is achieved by using special high dielectric constant ceramics, resulting in a reduction of the effective wavelength in the medium.

Multilayer planar filters fabricated using multilayer ceramic (MLC) technology based on low temperature co-fired ceramic modules (LTCC), and multilayer LTCC based filters can have a volume $\frac{1}{40}^{th}$ that of ceramic cavity filters. Such devices are being developed for data communication equipments, and digital cordless telephones, where unlike cellular applications, narrow bandwidths and large roll-offs are not required. These filters may use non-traditional metallization techniques used in ceramic technology to achieve metal thicknesses of approximately 100 µm to lower higher frequency losses. Due to other fundamental limits on the technology, the MLC and LTCC filters do not perform as well as the cavity filters. For example, one limitation is in the lack of flexibility of choosing a thickness (e.g., 4 mil<thickness<8 mil) of the dielectric sheets that make up the ceramic components. Additionally, the multilayer ceramic filters come with the disadvantage of higher costs due to the non-traditional processes used in making the multilayer ceramic filters. An example of higher costs is in the inherent higher temperatures of processing (e.g., >800° C.) compared to organic laminate processing (e.g., <230° C.). Additionally, one can leverage the economies of scale when using organic laminate processing which can handle batch processing of 18"×12" panels as compared to a nominal maximum of 8"×8" for LTCC and 6"×6" for MLC technologies.

While realizing the problems with ceramic and advantages with organic laminate processing in terms of costs, filters fabricated in organic substrates generally have not delivered the performance of cavity filters or multilayer ceramic filters. The bandwidths realized by the organic filters have not been small enough and the insertion loss too high for even large bandwidth applications. See, for example, Son, M. H., Kim, Y. J., Lee, S. S, "Low-Cost Realization of ISM Band Pass Filters Using Integrated Combline Structures," 2000 *Asia-Pacific Microwave Conference*, pp. 1294–1297; G. Hong and M. Lancaster, *Microstrip Filters for RF/Microwave Applications Design*, Wiley, June 2001.

Thus, there is an unsatisfied need in the industry for a high frequency, low loss, inexpensive bandpass filter having a relatively small footprint.

SUMMARY OF THE INVENTION

The present invention comprises integrated passive devices incorporating topologies suitable for organic processes and that perform filtering using lower-cost, lower-temperature, higher performing organic processing. These filters can meet the specifications of cavity filters, MLC and LTCC filters with equivalent or better performance in smaller or similar footprints. In particular, the present invention comprises methods and topologies of making devices that can be directly integrated in multilayer boards or packaged as a surface mount device (SMD) or ball grid array (BGA)/chip scale package (CSP) device.

In accordance with an embodiment of the present invention, a small, thin plane type narrow-band bandpass filter to be used for a portable telephone, cell phones, wireless infrastructure, WLAN, and the like, includes a plurality of end short-circuited hybrid CPW/stripline/microstrip meander/straight inductors or transmission line resonators formed close to one another on a first organic dielectric substrate or on multiple dielectric substrates interconnected by via connections, and in proximity to one another in order to be directly magnetically coupled to each other.

In circumstances where the inductors do not provide the desired parasitic capacitance, each inductor may be connected to separate shunted parallel plate (i.e., two or more plates) open-ended microstrip stub capacitors, which together form the resonators. In circumstances where the magnetic coupling between the inductors does not provide the desired coupling, the resonators can be electrically coupled further using a series parallel plate/inter-digital capacitor and/or an inductor. The resonators can also be coupled magnetically and capacitively. In addition, a parallel plate/inter-digital capacitor, an inductor or a transmission line can be used on either side of the two resonators at the input and output terminals of the device for impedance matching purposes.

In accordance with an aspect of the present invention, the dielectric material(s) used to achieve capacitance is virtually any low cost, high performance organic, such as liquid crystalline polymer (LCP) or polyphenyl ether (PPE), in a laminate or thin film. The dielectric constant, loss and thickness of the organic laminate is imperative to achieve the range of capacitances, and density needed for such applications. For example, the dielectric constant should be between approximately 2 and 100, the loss should be less than approximately 0.01, and the thickness should be between approximately 10 microns and 1000 microns. The present invention is capable of providing a range(s) of capacitances by sandwiching thin organic dielectrics (e.g., approximately less than 50 microns in thickness) with reasonable relative dielectric constants (e.g., approximately 2 to 100). The capacitance range available is from picofarads to femptofarads.

If the dielectric is too lossy for the purposes of integrating capacitors, then discrete capacitors can be used to compensate for the loss in the dielectric. This can be a cost-effective solution when compared to using multilayer ceramic, LTCC or cavity filters. The performance, however, may be dependent on the performance of the discrete capacitors.

The present invention further comprises co-planar waveguide (CPW)-type topologies, which make it easy to add grounded/shunted elements. The use of CPW topologies provides for additional paths for excess currents to sink from areas of current concentration, thereby reducing coupling of devices magnetically and electrically. Additionally, CPW topologies allow for a reference voltage in proximity to the signal carrying elements, which enables components like diplexers and duplexers that need many more inductors and capacitors than what is required in a bandpass filter, low pass filter and high pass filter.

In accordance with an aspect of the present invention, an all organic filter in accordance with the present invention can be integrated in a multilayer board because both use organic technology. A board typically is used as a carrier of such devices, which are mounted on the board in SMD or BGA/CSP configuration. However, if desired, a filter in accordance with the present invention using organic materials can be constructed in a stand alone SMD or BGA/CSP form to make it mountable on a multilayer board.

The design of the filters is accomplished in such a way that the final packaging of the device in stand-alone form or as an integrated device is done by sandwiching one or more thicker organic cores with metal on one or more sides to provide shielding from interferes and radiation.

In accordance with the present invention, multi-layer filters using any suitable low cost, high performance organic (e.g., LCP and PPE) with the topology and layouts described herein can achieve the performance of not only the multilayer ceramic filters with the same form factors, but they also emulate the performance of cavity filter components in about one-tenth the volume and monoblock filters in about half the volume. Although such filter designs can be achieved in two layers, the process and design of the present invention allows for multiple layer (>2 layer) capacitors and inductors integrated to form even more compact devices having higher integration.

For example, a two pole filter constructed in accordance with the present invention using two metal layers on two sides of a thin laminate substrate and then shielded on both sides has a footprint of 3×3 mm, a height of 1.5 mm and emulates the performance of a 4×5 mm monoblock filter having a height of 1.8 mm. On a 12"×12" substrate, it is possible to fabricate approximately 6500 such components with filter-to-filter spacing included, which illustrates its cost effectiveness. A filter according to the present invention requires just two patterned metal layers because of the CPW-type topology, as compared to the multi-layers in ceramic filters or molded cavity filters. This also reduces design time, processing time, and fabrication cost as compared to ceramic filters or molded cavity filters.

While the present invention is disclosed in the context of filters and resonator elements, the teaching of the present invention can be readily applied to other integrated passive devices (IPDs) such as diplexers, duplexers, baluns, power combiners, band-stop/band elimination filters and power dividers, low-pass filters and high-pass filters. All of these different components only comprise inductors, capacitors and/or transmission lines in topologies only slightly different from the bandpass filters disclosed herein.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The operation of a filter in accordance with the present invention is explained below with reference to the bandpass filter 10 of FIG. 1A. However, it will be appreciated by those of ordinary skill in the art that the teachings of the present invention readily apply to other integrated passive devices. Accordingly, the scope of the present invention is not limited to bandpass filters, but is inclusive of other devices such as but not limited to diplexer, duplexer, multiplexer, baluns, power combiner, band-stop/band elimination filter and power divider low-pass filter and high-pass filter.

Figure 1A:
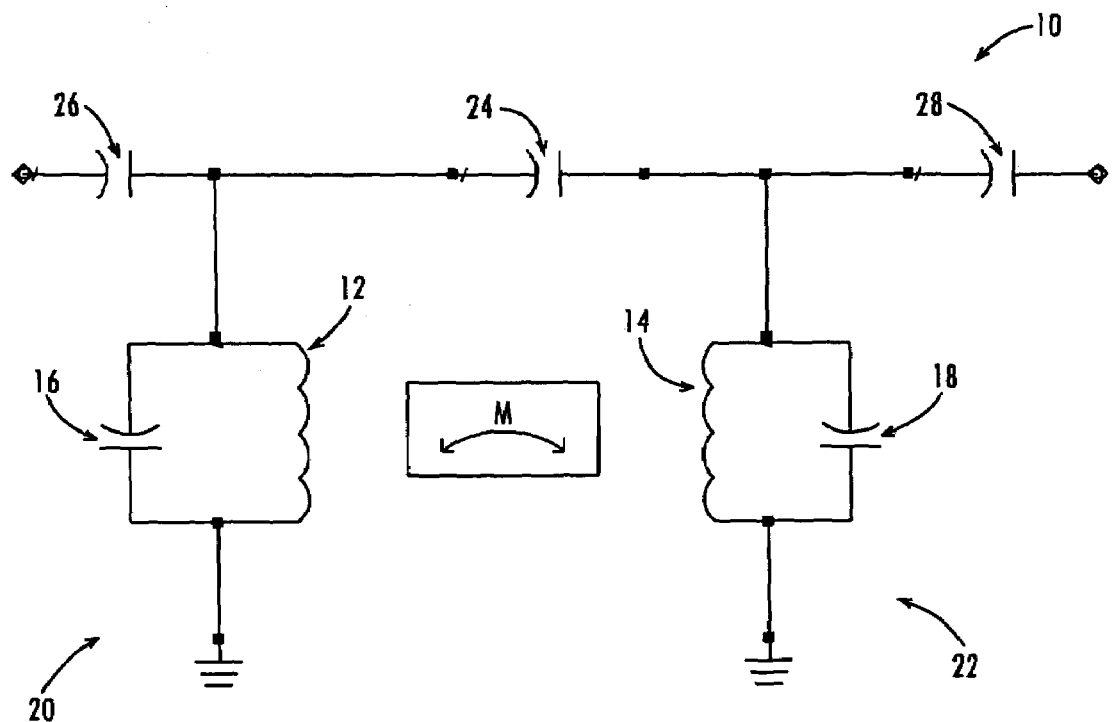
FIG. 1A is a first equivalent circuit diagram for explaining the operation of the dielectric filters shown in FIGS. 2, 3 and 4.

With reference to the figures, FIG. 1A is an equivalent circuit diagram of a dielectric bandpass filter 10 in accordance with the present invention. In FIG. 1A, inductors 12, 14 cooperate with their corresponding capacitor 16, 18, respectively, to form resonators 20, 22, respectively. The inductors 12, 14 correspond to the stripline or CPW/stripline or CPW/microstrip inductors discussed below with reference to FIGS. 2–4. The capacitors 16 and 18, respectively, correspond to the capacitors formed on the same layer as inductors 12 and 14 or by using discrete capacitors. The capacitor 24 corresponds to the capacitor formed for the purposes of inter-resonator coupling. In FIG. 1A, capacitors 26 and 28, respectively, provide matching to the desired impedances at the input and output. In addition, M is the magnetic coupling between the inductors 12 and 14. The inductances of inductors 12 and 14 could also represent equivalent inductance components of the resonators, and capacitances of capacitors 16 and 18 could represent capacitance components of the resonators. While the circuit topology shown in FIG. 1A depicts one embodiment of a two pole filter, an additional pole can be attained by the mutual inductance between inductors 12, 14 and the capacitor 24. In addition, resonators may be added with the required coupling elements by adding more inductors and capacitors in various configurations to achieve transfer characteristics that emulate such responses as first order, second order to nth order butterworth, chebychev, elliptic, blinkoff, symmetric, asymmetric, notch added filters using topologies such as nodal capacitor coupled, nodal-inductor coupled, shunt-input geometry, input geometry or mesh capacitor coupled.

The stopband characteristics of a filter is a prime factor in determining the isolation between the transmitting and receiving paths in duplexer designs. It is well known that the stopband rejection may be enhanced, either by increasing the number of resonators as mentioned earlier, or by adding transmission zeros.

Figure 1B:
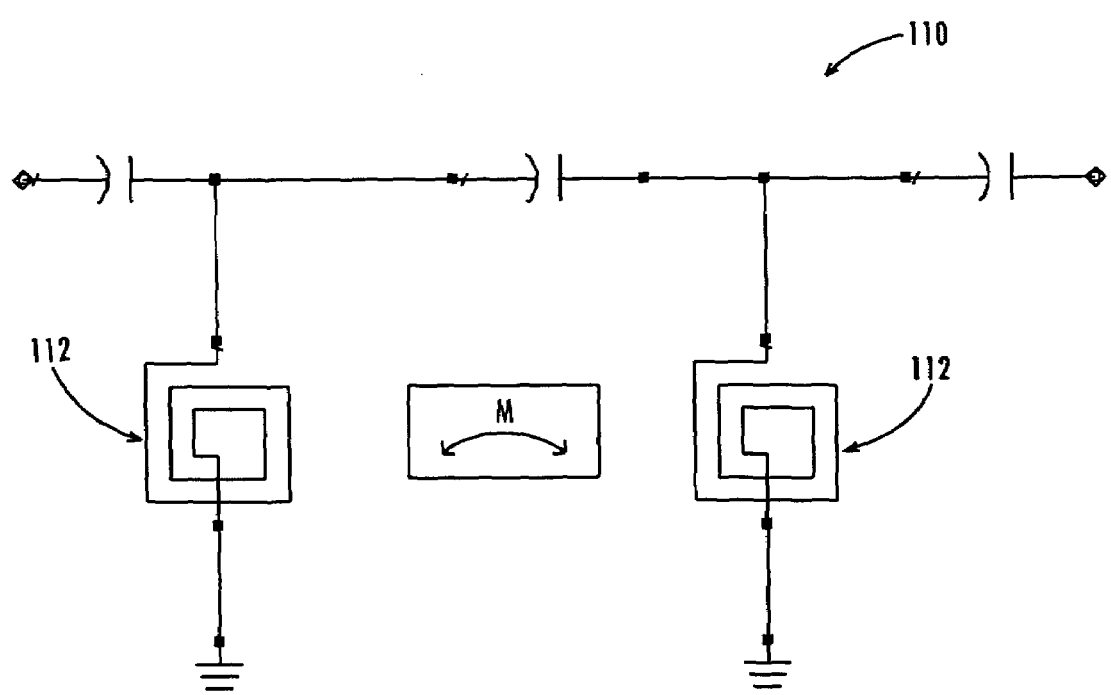
FIG. 1B is a second equivalent circuit diagram for explaining the operation of the dielectric filter of FIG. 1A using transmission lines or inductor resonator elements.

FIG. 1B is an alternative equivalent circuit diagram 10 of a dielectric filter using transmission lines or inductor resonator elements, wherein the inductors 112 resonate at a desired center frequency. The physical parameters of the circuit 110, such as the number of turns, length of conductor, outer and inner diameter, can be altered to resonate the inductor 112 at the desired frequency. This reduces the number of components required to achieve a filtering function by removing the need for capacitors of the resonators. However, a disadvantage is the increase in length of the metallization to increase the capacitance, though the increased inductance could increase loss in the circuit. If the inductor element becomes too large or too lossy, then it may be desirable to use an alternative circuit design, such as that illustrated in FIG. 1A. It should be noted that in the circuits of FIG. 1A and FIG. 1B, the coupling between the components can be achieved by magnetic coupling, electric coupling or a combination thereof.

Illustrative physical layouts of dielectric filters in accordance with the equivalent circuit diagram of FIG. 1A are depicted in FIGS. 2–4. The dielectric filters of FIGS. 2–4 have a two-pole structure and an additional pole attained by the mutual inductance and the capacitor 24 according to the equivalent circuit diagram shown in FIG. 1A.

Figure 2A:
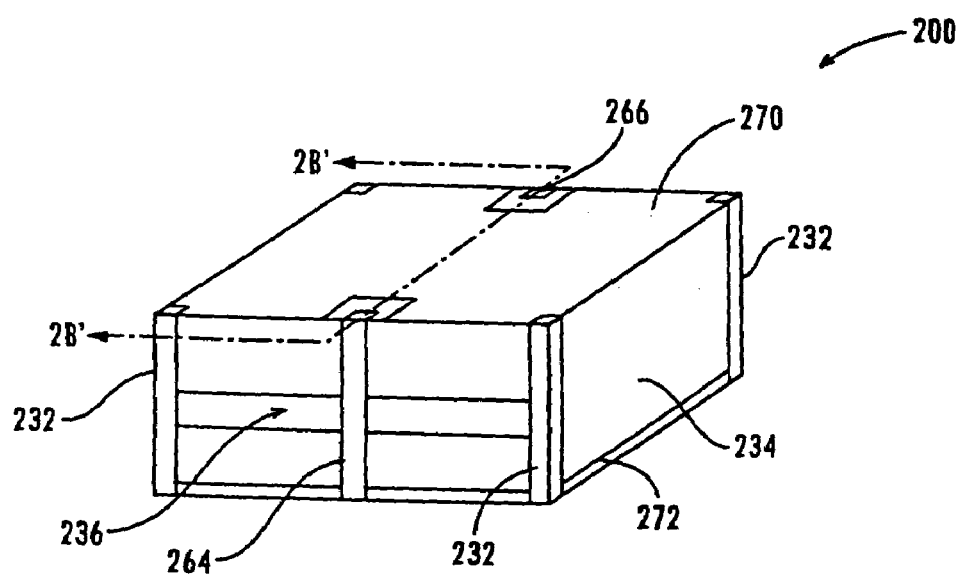
FIGS. 2A–2C show several views of a first organic dielectric filter according to an embodiment of the present invention.
Figure 2B:
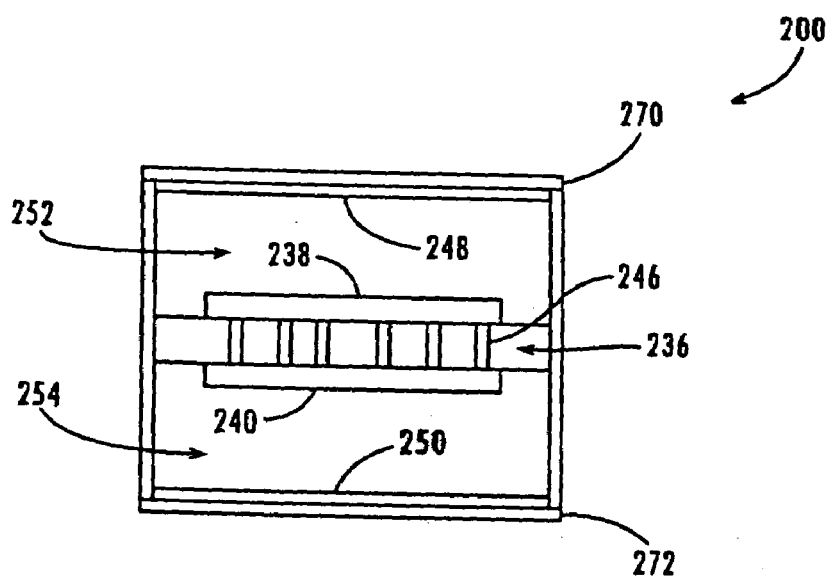
Figure 2C:
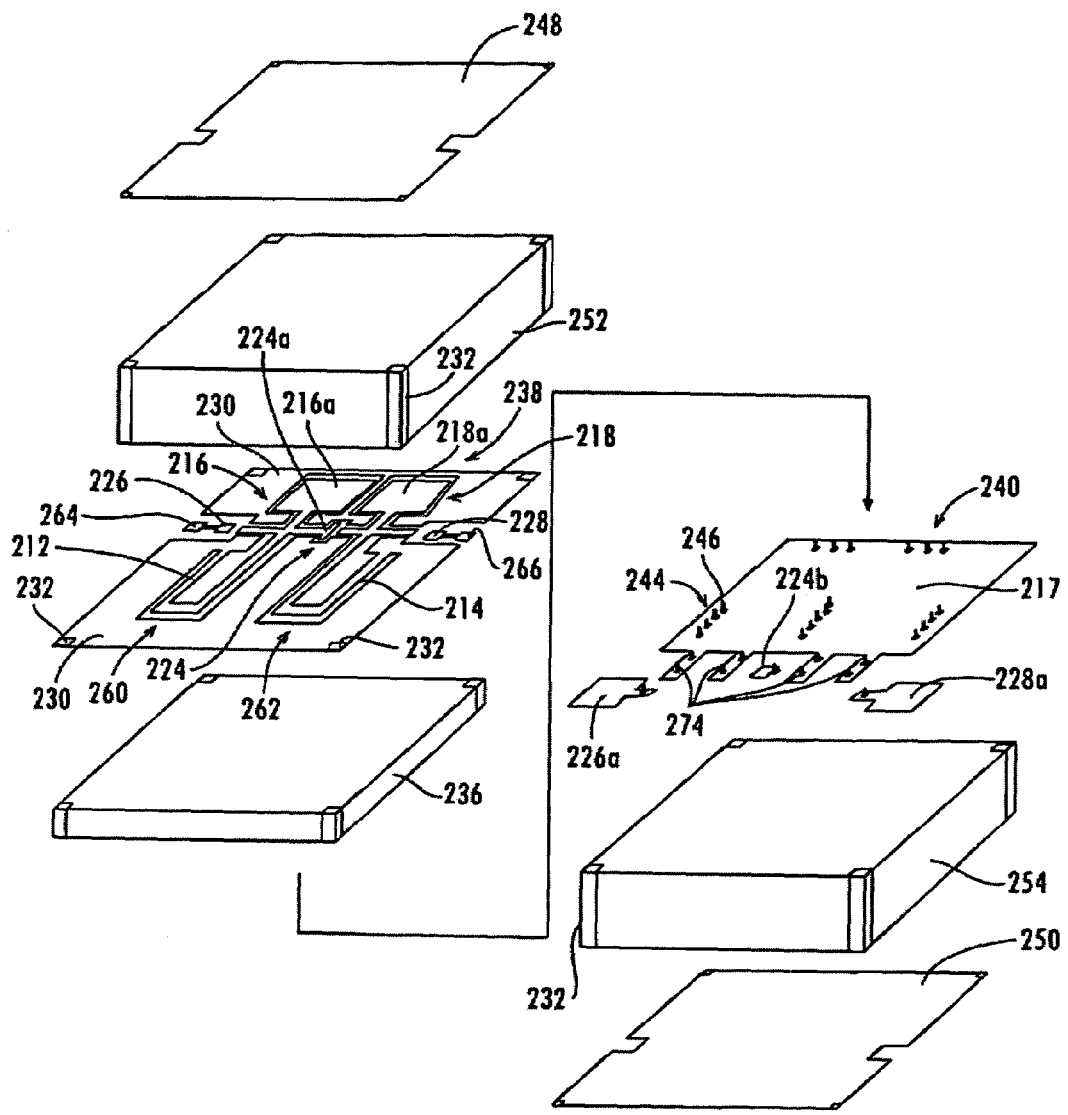

With general reference to FIGS. 2A–2C, illustrated is a surface mounted device (SMD) embodiment of the filter illustrated by the circuit of FIG. 1A in accordance with the present invention. Specifically, the organic bandpass filter 200 comprises inductors 212 and 214, which are meandering inductors formed close to each other on an organic dielectric layer 236 (which can be a thin laminate such as LCP or PPE, but is not limited to these) and is preferably configured as either a shorted hybrid CPW-stripline (where lines that form meandering inductors 212 and 214 are connected to a coplanar ground, that is, in-built shielding 230), or a stripline in the presence of coplanar in-built shielding 230 and additional grounds 248 and 250 that are connected to the plated through holes 232 and/or external shield electrodes 234.

Since these inductors are very close to each other, the magnetic coupling between these filters, represented by M in FIG. 1A, can increase the pass bandwidth of the filter, thereby decreasing its performance. However, an inter-resonator parallel plate coupling capacitor 224, (with or without the coplanar in-built shielding 230) formed using two disconnected metal plates (one plate formed using patterning conductive layer 238 and the other plate formed using patterned conductive layer 240) and shown as capacitor plates 224a, 224b is provided. The capacitor plates 224a, 224b sandwich the first organic dielectric layer 236 in such a manner that the each plate of the inter-resonator coupling capacitor electrode is connected to separate resonators which helps compensate the effect of the magnetic coupling and helps make very compact filters. The center capacitance can be as small as femptoFarads or as large as picoFarads for achieving the specified bandwidths. The smaller capacitance helps reduce the bandwidth. Additionally, capacitor 224 in parallel with the mutual inductance equivalent gives a pole in the lower band or upper band.

The bottom plate formed by the conductive layer 240 connects to inductor 212 using one or more microvias in the organic dielectric layer 236, such as the vias 244 with pads 246 for landing and capturing the via. First and second shield electrodes 248, 250 formed respectively on the organic core layers 252, 254, wherein the core layer 252 and 254 are disposed so as to sandwich the organic dielectric layer 236 there between. A first resonator 260 formed by inductor 212 and capacitor 216 and a second resonator 262 formed by inductor 214 and capacitor 218 are electrically coupled to each other through the parallel plate capacitor 224, whereby an inter-resonator coupling is effected in combination with said magnetic coupling and electric coupling.

In a dielectric filter according to the present invention, where the inductors do not provide the needed capacitance in the desired length, the inductors 212, 214 can be connected in similar fashion as the capacitor 224 to separate grounded/shunted parallel plates 216a and 218a, respectively, of capacitors 216 and 218, respectively, using the same first organic dielectric layer 236 as the sandwiched dielectric, which then together form the resonator pairs 260, 262.

The equivalent inductance L obtained with one of the meander inductors, 212, 214, and the equivalent capacitance C due to one of the capacitors 216, 218, resonates approximately at frequency Fo, the center frequency of the filter, as defined by Equation (1) below:

$$\text{whereby } Fo \sim \sqrt{1/(LC)} \quad (1)$$

The capacitor plates 216a and 218a have a corresponding ground plate 217 on the opposite surface of the organic dielectric layer 236. Having a common plate does cause coupling between the capacitors which has to be accounted for during the design by including it as the mutual inductance between the parasitic inductance of each capacitor 216, 218. This coupling can be used to achieve further poles; however if the coupling causes problems in the passband during the synthesis stage it could be reduced by either dividing plate 217 into separate plates or by adding several vias on pads 274 that connect plate 217 to in-built shielding 230 on the side of the inductors 212 and 214, thereby helping excess currents to sink and thereby reducing coupling between components.

In addition, parallel plate/interdigital capacitors 226 and 228, can be used on either side of the first and last resonator elements 260, 262 at the input and output terminals of the device for impedance matching purposes. Alternatively, inductors or transmission lines or a combination of capacitor(s), inductor(s) and transmission line(s) can be utilized, as desired. If capacitors 226, 228 are used for matching purposes, it follows the center capacitance is that of capacitor 224 in terms of the nominal capacitances required, that is, the capacitance from capacitor 226 and capacitor 228 are proportional to capacitor 224.

A dielectric filter according to the embodiment of the present invention illustrated in FIGS. 2A–2C can comprise at least two external shield electrodes 234 respectively formed on different side surfaces of the laminated structure, which comprises at least the organic dielectric layer 252, 236, 254, and that are connected to the shield electrodes 248 and 250. This may or may not be desired for shielding purposes in a CPW topology, wherein the use of plated through holes 232 on the four corners is sufficient. Utilizing the plated through holes 232 may save additional room required for the external shield electrodes 234 and also may save the processing cost involved. However, in stripline and microstrip filter topologies, plated through holes 232 and external shield electrodes 234 together provide the connection for the shorted inductors/resonators and capacitors at any point along the respective sides. Alternatively, the CPW topology with coplanar in-built shielding 230 on the same plane of the first dielectric layer provides the shielding internally, and provides for the ground connectivity to the resonators/inductors and capacitors. However, in general, in more noisy environments it may be preferred to also have the external ground electrodes.

The dielectric filter 200 also comprises an external input terminal electrode 264 and an external output terminal electrode 266 which are formed on one side surface of a laminated body comprising at least dielectric sheets 252, 236, 254, and an external ground electrode, (such as shield electrodes 248, 250, through holes 232 or side shield electrodes 234) formed between said external input and output terminal electrodes 264, 266 on one side surface.

The shield electrodes 248 and 250 formed on the dielectric core layers 252 and 254, respectively, are preferably of the shape and patterned to leave room for the landing terminals of input and output terminal electrodes 264 and 266. For purposes of illustrating the present invention, the shield electrodes 248, 250 are shown in FIGS. 2B and 2C, but not 2A.

The first organic dielectric layer 236 can comprise single side copper LCP laminate or the like, such as PPE, N6000, epoxy based N4000-13, or any other suitable low loss dielectric.

The protective layers 270, 272 are formed on shield electrodes 248, 250 opposite dielectric core layers 252, 254, respectively, to protect the structure from environmental affects such as oxidation and also to create a pattern for solder to flow on to the input output terminals 264 and 266 and ground pads formed by plated through holes 232. The protective layers 270, 272 may comprise a solder mask, or in more demanding applications, with higher tolerances, other materials such as prepreg or LCP may be desired. For purposes of illustrating the present invention, the protective layers 270, 272 are shown in FIGS. 2A and 2B, but not 2C.

In the dielectric filter according to the present invention, as illustrated in FIGS. 2A–2C, an initial step to making a connection between devices using vias 244 is done by drilling through holes (as small in diameters as the thickness of the dielectric used) through the LCP layer (or any other appropriate organic dielectric) and copper layer. Then both sides of LCP copper laminate are metallized, such as by electroless or vacuum deposited copper. Copper is then electroplated on both sides of laminate to form the metallized patterns 238, 240 on the organic dielectric layer 236. The copper is then printed and etched to define the key filter components.

In the dielectric filter according to the embodiment illustrated in FIGS. 2A–2C, the dielectric core layers 252, 254 can be laminate LCP or appropriate dielectric with generally larger thickness than the first substrate and aluminum, copper, Molybenum metal (for high power applications) on both sides of filter to a given thickness to encapsulate components. All metals are preferably electroplate and etched and patterned on top and bottom of the device to leave space for signal input and output.

In a dielectric filter according to the embodiment illustrated in FIGS. 2A–2C, the side wall ground shield electrodes 232, 234 can be fabricated, if desired, by single or multiple connected drilled and plated through holes or using a saw cutting device and then connected via electroless or sputter seeded copper in through hole. The copper can be electroplated in the through hole and on the surface. The copper can then be printed and etched to form SMD connection. The process flow for a two layer plus the packaging of the SMD device is explained in greater detail in connection with FIG. 5.

Figure 3A:
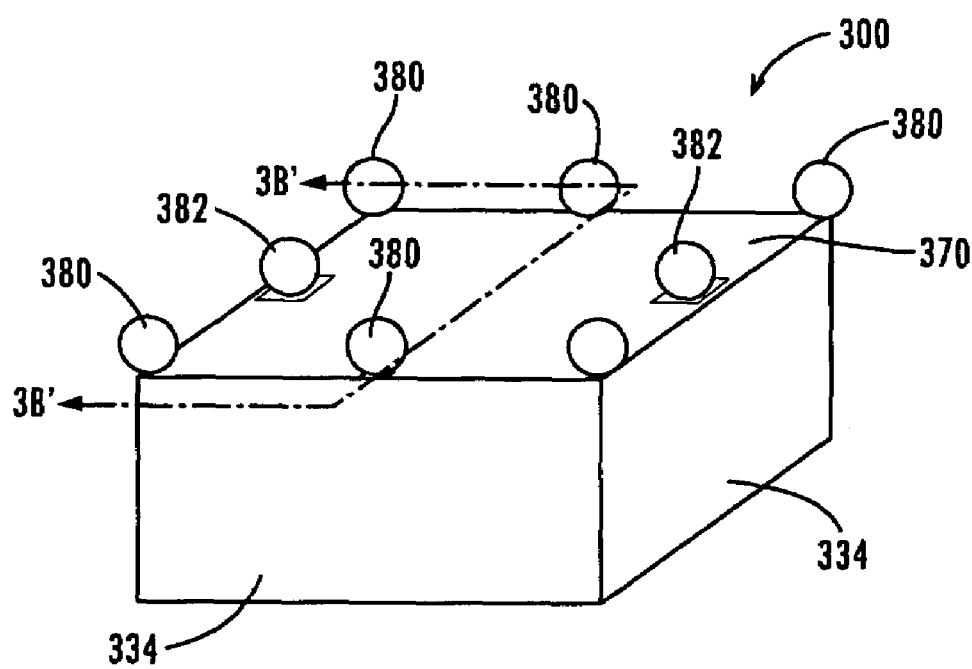
FIGS. 3A–3C show several views of a second organic dielectric filter according to an embodiment of the present invention.
Figure 3B:
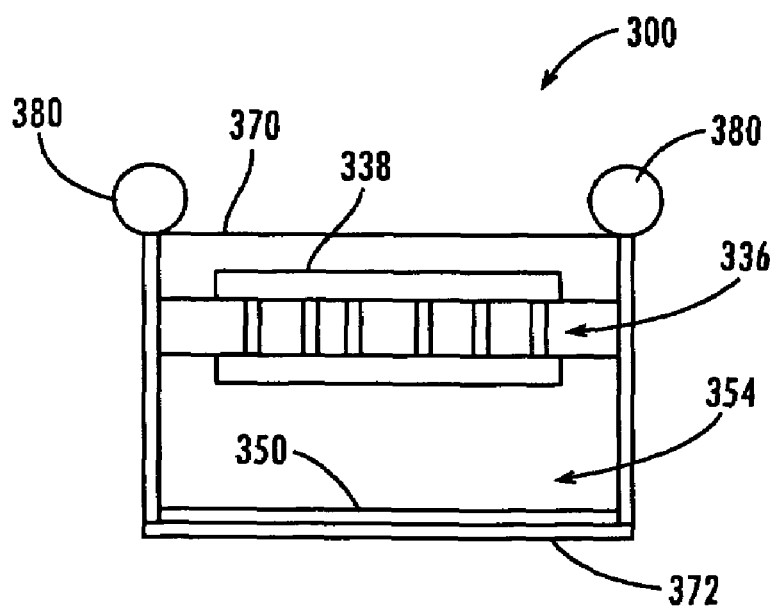
Figure 3C:
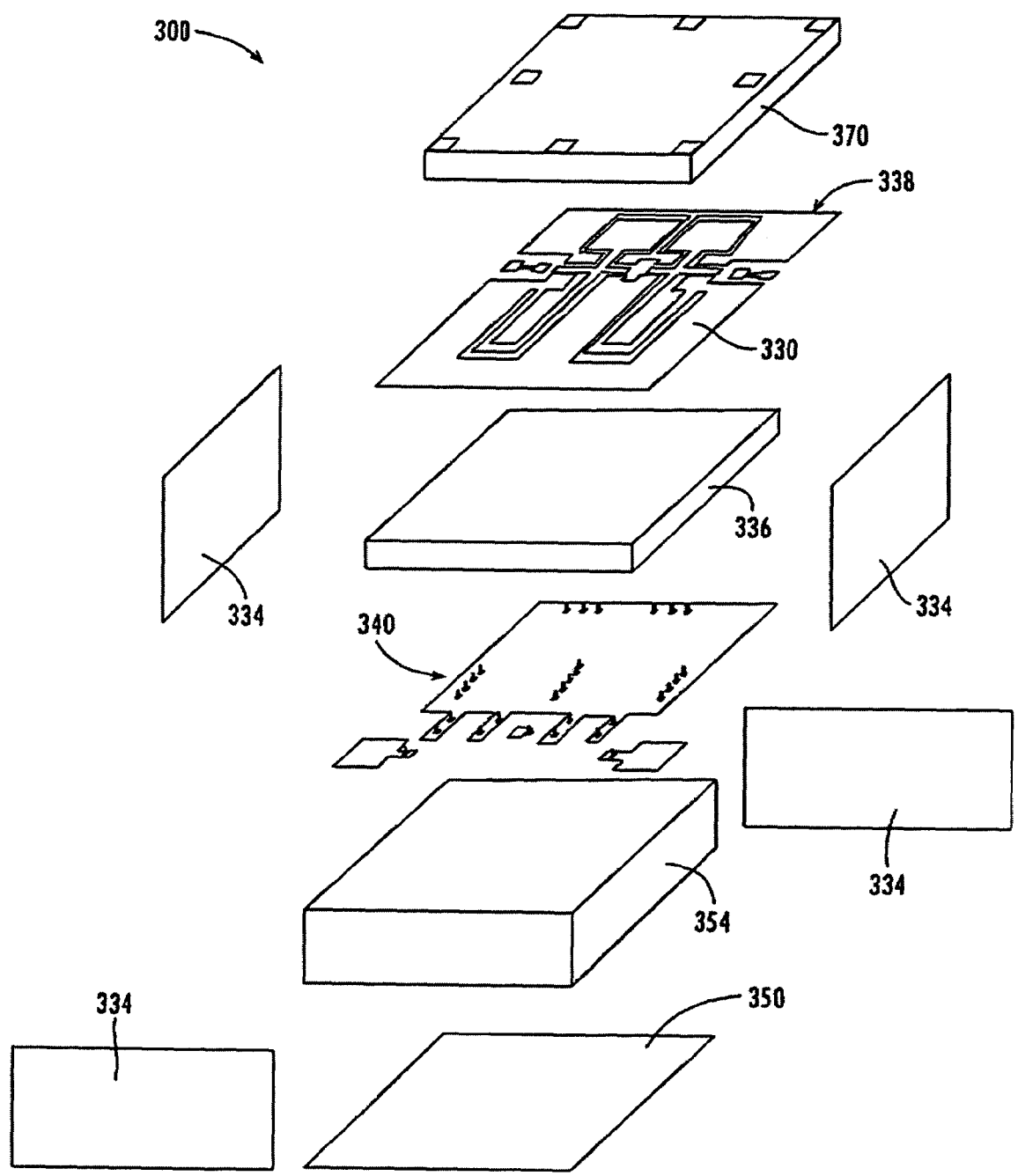

With reference to FIGS. 3A–3C, illustrated, is a BGA/CSP embodiment of an organic bandpass filter 300 in accordance with the present invention. Essentially, all of the internal structure in the filter depicted in FIGS. 2A–2C and FIGS. 3A–3C are similar except the packaging is different, and thereby, the means by which you package it. For example, in FIGS. 3A–3C the thin laminate (e.g., the organic dielectric layer 336) is not packaged between two thick cores, but is packaged with one core layer 354 on one side and a first protective layer 370 on the opposite side substrate 336. The opposite side of the thicker core 354 is metallized to form a shield electrode 350, and a second protective layer 372 is disposed over the shield electrode 350. The protective layers may comprise a solder mask, or in more demanding applications, with higher tolerances, other materials such as prepreg or LCP may be desired.

This packaging of filter 300 renders a microstrip or CPW/microstrip filter device with only shield electrode 350. Instead of using through holes to connect the device input/output and ground terminals, solder balls 380 are utilized. Side wall ground shield electrodes 334 are used to connect the in-built shielding electrodes 330 and shield electrode 350 and, if desired, to solder balls 380.

Alternatively, this could be done by plated through holes, if provided. As discussed above, having both plated through holes 332 and side wall shield electrodes 334 is not typically necessary, and generally they can be utilized in the alternative of one another. For purposes of illustrating the present invention, side wall grounded shield electrodes 334 are shown in FIG. 3A–3C. The solder balls 382 connect the input and output terminals to the bandpass filter. The solder balls and the packaging is constructed using the methodology provided below in connection with FIG. 6. The protective layer 370 (also known as a passivation layer mask, solder mask, bondply layer or low temperature thermoset, thermopolymer material compound to inner laminate) may be utilized to provide openings for the solder balls, as well known in the art.

Figure 4A:
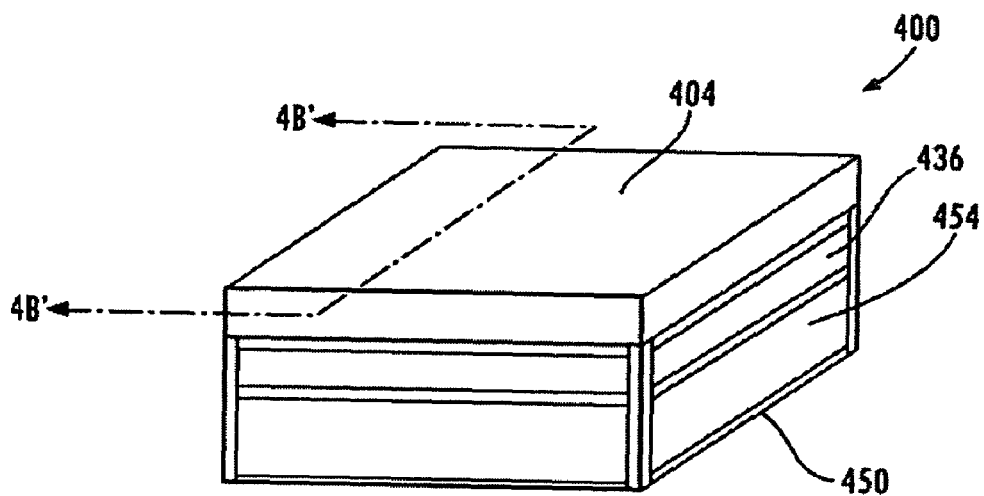
FIGS. 4A–4B show several views of a third organic dielectric filter according to an embodiment of the present invention.
Figure 4B:
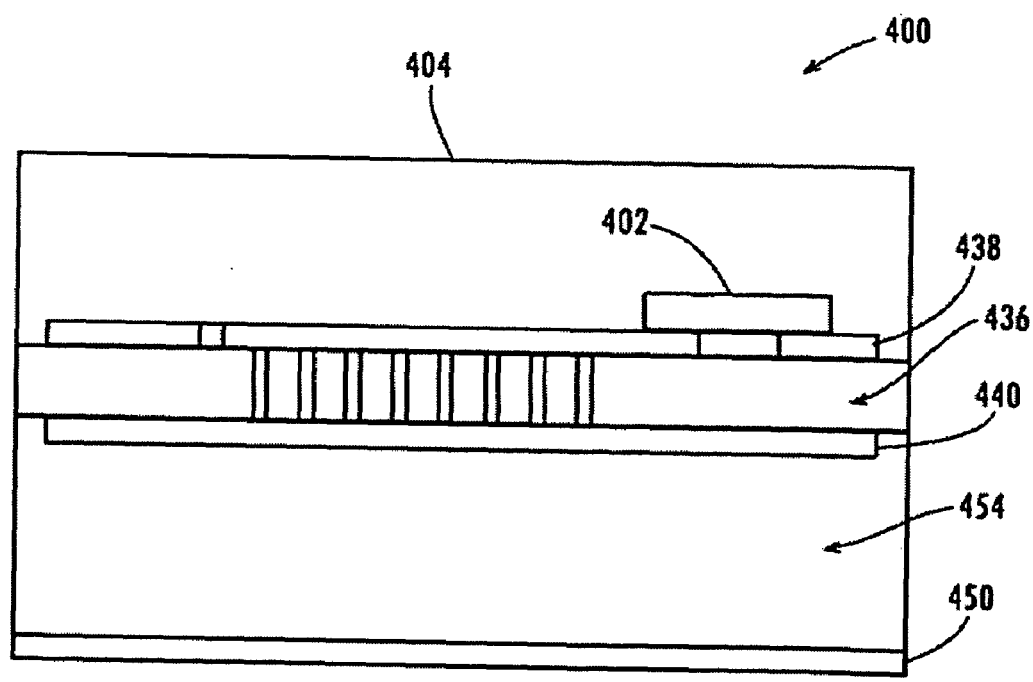

With reference to FIGS. 4A–4B, illustrated is an embodiment of a filter device 400 in accordance with the present invention, which utilizes discrete capacitors 402 and external shielded formed by a metallic case or cap 404. Essentially, all internal structure in FIGS. 2A–2C and FIG. 3A–3C are similar except the packaging is different in the embodiment of FIGS. 4A–4B, and thereby the means by which you package it. For example, in FIGS. 4A–4C, an organic dielectric layer 436 (e.g., a thin laminate substrate) is not packaged between two thick cores, but only one core layer 454 on one side, wherein a shielding electrode 450 is metallized on the opposite side of the core layer 454. On the other side of the organic dielectric layer 436 is a metallic cap 404 with the appropriate height, which is used to provide a second ground reference. The organic dielectric layer 436 is metallized on opposing surfaces by patterned conductive layers 438 and 440, which are electrically connected by at least microvias in layer 436, as discussed with regard to the embodiments of FIGS. 2 and 3. Instead of using a thicker core on both sides of the substrate 436, this embodiment uses a core layer on one side and air as a dielectric on the other. This renders itself into a stripline or CPW/stripline device. Through holes are used to connect only the core metal to the internal metallic structure whereas the metallic cap 404 is connected using solder connections to the relative terminals. The metallic cap 404 can have openings where needed for the input and output terminals. It is important to note that the embodiment is not restricted to using discrete capacitors. The capacitors shown in FIGS. 4A–4B can also be embedded in the substrate, if needed, as discussed previously.

The following are examples of various embodiments of the present invention, wherein each illustrative embodiments discloses several aspects of the invention.

II. Illustrative Methods for Fabricating Stand Alone Filters

Figure 5:
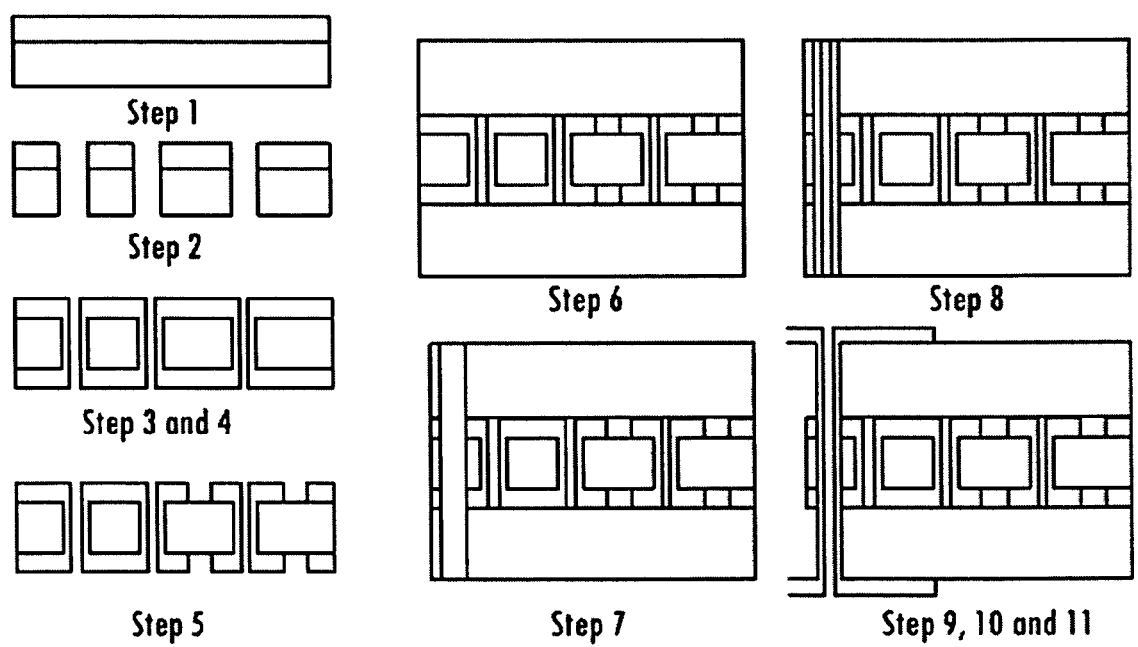
FIG. 5 illustrates a fabrication methodology for an organic dielectric filter according to the present invention, such as the first organic dielectric filter of FIGS. 2A–2C.

An illustrative process for fabricating an LCP based IPD, such as the filter illustrated in FIGS. 2A–2C, configured as a surface mount device (SMD) in accordance with an embodiment of the present invention is now described with reference generally to FIG. 5. Initially, a starting material is selected, which is preferably a reinforced or non-reinforced LCP laminate that can be unclad, or cladded with copper foil on one or both sides of the LCP, as illustrated in Step 1. Alternate materials include other low loss organic laminates like PPE, PTFE composites, hydrocarbon ceramic composites, BT resin composites (e.g., Speedboard C), and thermosets (e.g., Hitachi MCL-LX-67F). Next, through vias are drilled through the LCP or other laminate and the layers of copper, as illustrated in Step 2. These microvias can be drilled with mechanical drilling, laser drilling or other suitable methods known to those skilled in the art.

Steps 3 and 4 involve the metallization of the through vias and laminate. In additive, semi-additive, or subtractive processes starting with unclad or copper clad LCP or other laminates, both sides of the LCP or other laminate and the vias are seeded using electroless plated, vacuum deposited copper or another deposition methods to form a continuous copper film. To achieve the target metal thickness for the device, electrolytic plating is done to build the copper on both sides of the laminate and in the vias in a single step. The circuit definition for the filter component can be done using subtractive, semi-additive or fully additive processes with panel or pattern electroplating of the copper followed by print and etch steps to define the filter circuitry, as illustrated in Step 5.

The fabricated device circuits are then packaged using vacuum or non-vacuum lamination of LCP or alternate laminate materials as detailed above in connection with Step 1, and/or Al, Cu, Mo metal (for high power applications) on both sides of the filter to provide sufficient thickness to encapsulate components, as illustrated in Step 6. The internal and external metal layers are connected, as needed, using plated through holes that can be drilled mechanically or with laser, photo, or plasma processes to provide signal and ground connections and SMD terminals, as illustrated in Step 7. The two edges of the device without the through hole can also slotted using mechanical drill/rout/mill, laser cutting, or sawing processes to provide for additional shielding of the device during subsequent metallization. The drilled through holes and shielding slots are seeded with electroless plated or sputter/vacuum deposited copper to provide a bus layer in substantially the same manner as described above in connection with Step 3, as illustrated in Step 8.

With reference to Steps 9, 10, and 11, the final metal thickness for the outer layers is built up by electroplated copper in the through holes, shielding slots, and on the top and bottom surfaces. Subtractive, semi-additive, or additive processes may be used to define the outerlayer ground circuits and SMD terminals for connection, with print and etch processing of the copper, as described above in connection with Steps 4 and 5. The device is then finished with the addition of terminal metals appropriate for SMD assembly and soldering processes. These finishing metals on the device terminals are common plated metals or alloys like electroless Ni—Au, immersion tin, immersion silver, electroplated Ni—Au, solder (HASL), or organic finishes (OSPs) and the choice depends on the intended application.

The fully fabricated wafer is then singulated into individual filter components. The singulation can be done using high speed dicing saws or alternate methods such as punching or routing/milling. An advantage of this fabrication process is the ability to fully electrical test the components either before or after singulation.

Figure 6:
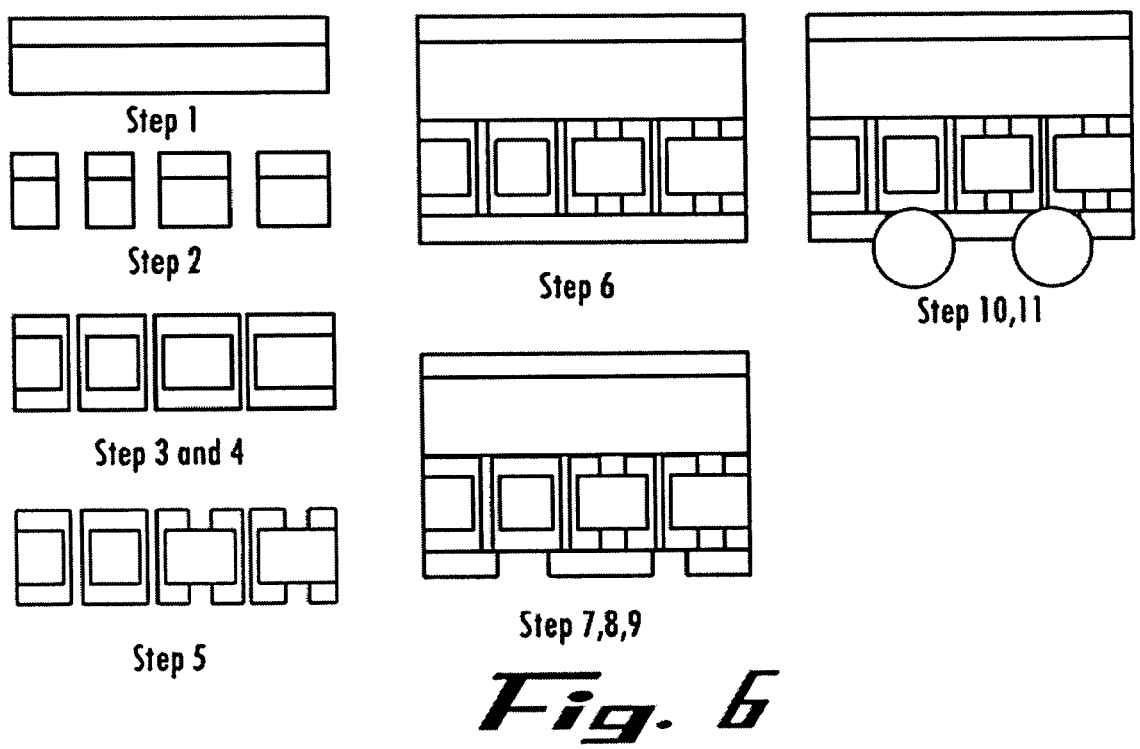
FIG. 6 illustrates a fabrication methodology for an organic dielectric filter according to the present invention, such as the organic dielectric filter of FIGS. 3A–3C.

Another illustrative process for fabricating an LCP based IPD, such as the filter illustrated in FIGS. 3A–3C, configured as a ball grid array (BGA) or chip scale package (CSP) in accordance with an embodiment of the present invention is now described with reference generally to FIG. 6. Initially, a starting material is selected, preferably a reinforced or non-reinforced LCP laminate that can be unclad, or cladded with copper foil on one or both sides of the LCP, as illustrated in Step 1. Alternate materials include other low loss organic laminates like PPE, PTFE composites, hydrocarbon ceramic composites, BT resin composites (e.g., Speedboard C), and thermosets (e.g., Hitachi MCL-LX-67F). Next, through vias are drilled through the LCP or other laminate and the layers of copper, as illustrated in Step 2. The microvias can be drilled with mechanical drilling, laser drilling or other suitable methods known to those skilled in the art.

Steps 3 and 4 involve the metallization of the through vias and laminate. In additive, semi-additive, or subtractive processes starting with unclad or copper clad LCP or other laminates, both sides of the LCP or other laminate and the vias are seeded using electroless plated, vacuum deposited copper or other common deposition methods to form a continuous copper film. To achieve the target metal thickness for the device, electrolytic plating is done to build the copper on both sides of the laminate and in the vias in a single step. The circuit definition for the filter component can be done using subtractive, semi-additive or fully additive processes with panel or pattern electroplating of copper followed by print and etch steps to define the filter circuitry, as illustrated in Step 5.

The fabricated device circuits are then packaged using vacuum or non-vacuum lamination of LCP or alternate laminate materials detailed above in connection with Step 1, and/or Al, Cu, Mo metal (for high power applications) on both sides of the filter to a given thickness to encapsulate components, as illustrated in Step 6.

On the other side of the filter component, a cover coat material, liquid photo imagable (LPI), or dry film solder mask is deposited using standard processes such as spin coating, curtain or roller coating, dry film lamination, spray coating and others, as illustrated in Steps 7, 8 and 9. This layer acts as a barrier to solder flow between terminals during subsequent reflow and component assembly. The component terminals are defined by opening windows in the cover coat/soldermask material to open the BGA pads for board level interconnection. This is done with processes such as photolithography or laser ablation. The device is then finished with the addition of terminal metals appropriate for BGA assembly and soldering processes. These finishing metals on the device terminals are common plated metals or alloys like electroless Ni—Au, immersion tin, immersion silver, electroplated Ni—Au, solder (HASL), or organic finishes (OSPs) and the choice depends on the intended application and compatibility with the solder or other alloy used for device-to-module/PWB interconnection.

With general reference to Steps 10, 11, 12, the interconnects are formed in the windows in the manner defined in Step 8 using Pb/Sn solder, or other lead free solders and metal alloys. Processes such as screen or stencil printing of solder paste and reflow, or plating processes can be used to form the bumps for interconnection. The BGA/CSP format of the filter components enables the testing of the components on the large area board prior to singulation. The testing can be done, for example, with probing techniques or using test sockets or fixtures.

The fully fabricated wafer is then singulated into individual filter components. The singulation can be done using high speed dicing saws or alternate methods such as punching or routing/milling. An advantage of this fabrication process is the ability to fully electrical test the components either before or after singulation.

III. Actual Devices

EXAMPLE I

Figure 7:
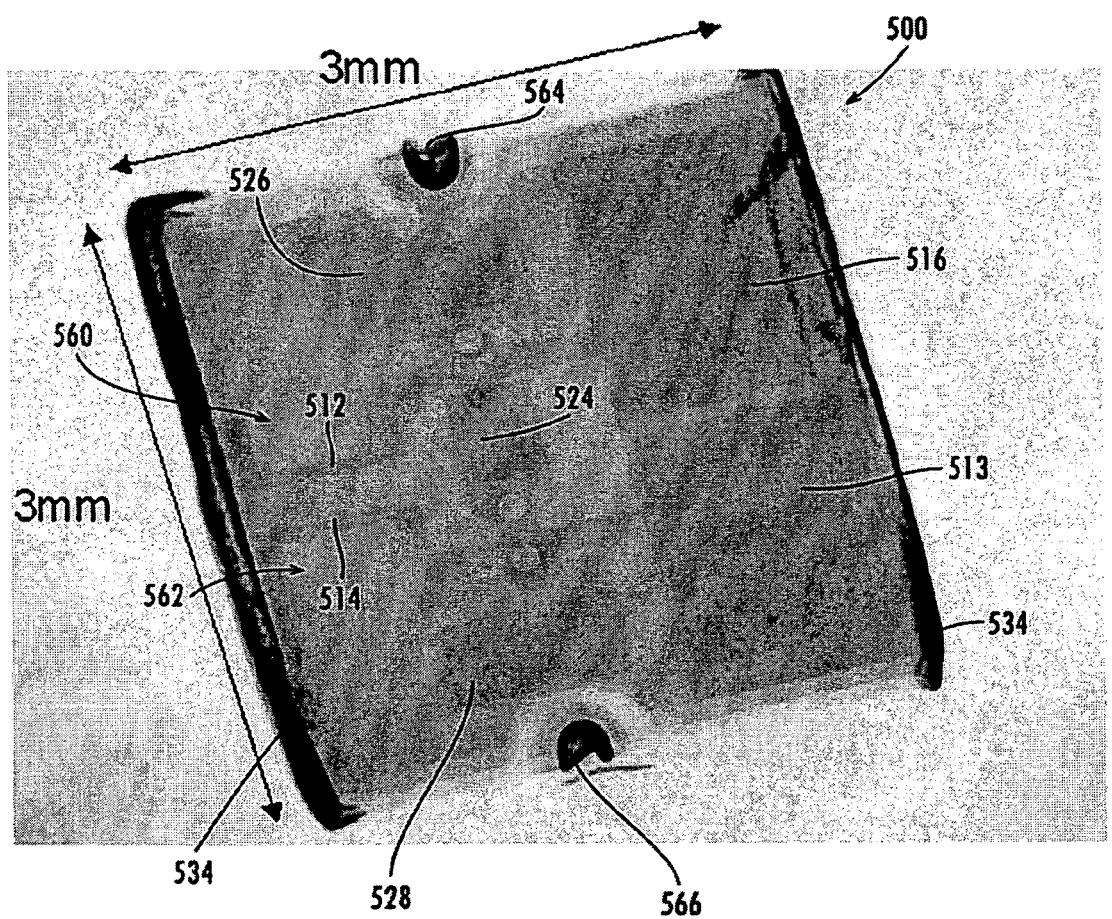
FIG. 7 is an X-ray from a top plan view of an organic bandpass filter in accordance with an embodiment of the present invention.
Figure 8:
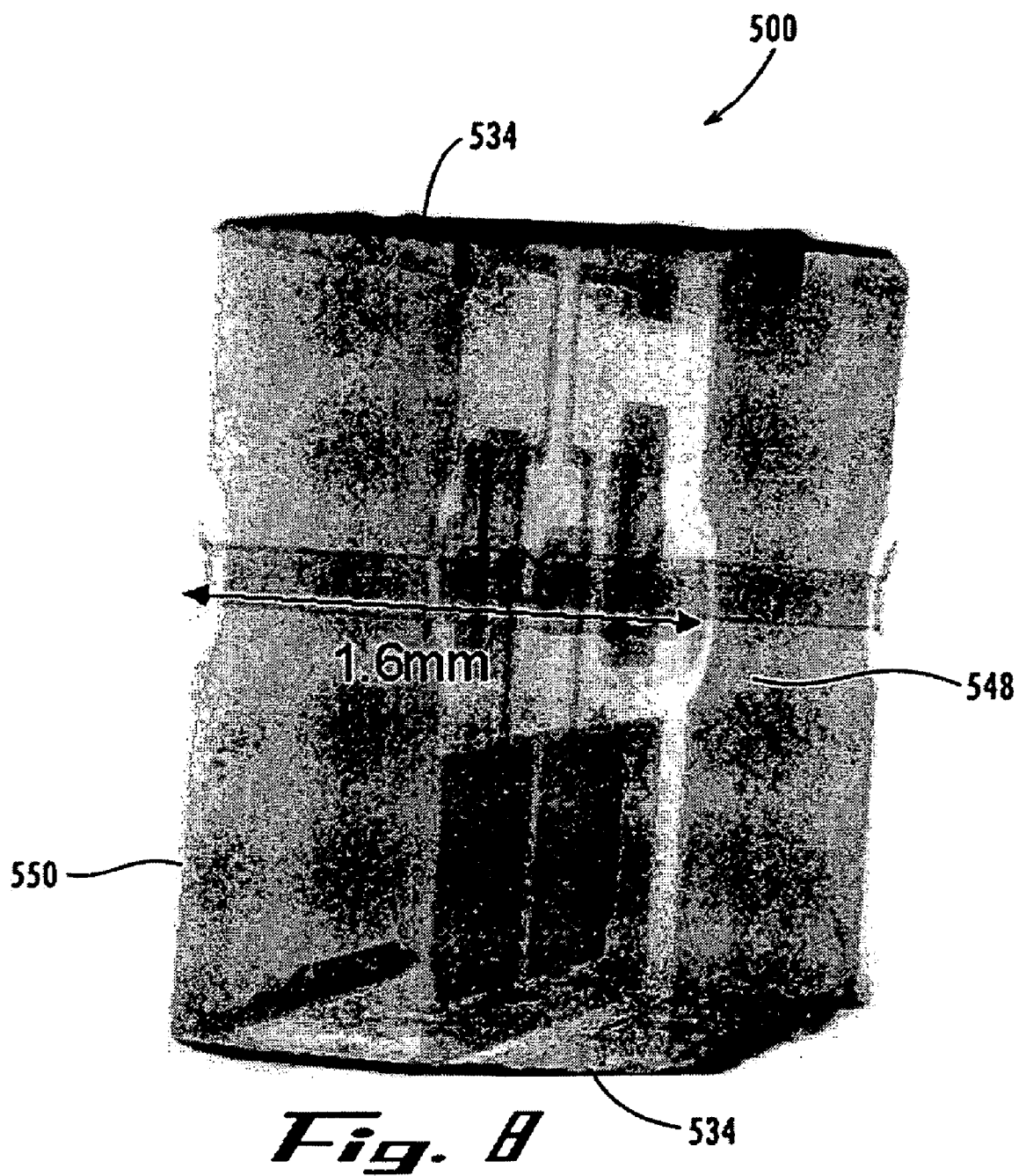
FIG. 8 is an X-ray from a side perspective view of the organic bandpass filter of FIG. 7.

An X-ray photograph of an organic bandpass filter 500 in accordance with an embodiment of the present invention is provided in FIGS. 7 and 8. The filter 500 comprises shorted hybrid CPW-stripline meander transmission line inductors 512, 514 formed close to each other on a first organic dielectric layer, which is a 50 μm thick layer of LCP, wherein the inductors 512, 514 are directly magnetically coupled to each other. Each inductor is connected to separate parallel plate capacitors 516, 518 by sandwiching the same dielectric sheet. An inter-resonator parallel plate coupling capacitor 524, is formed using two disconnected metal plates that sandwich the same organic dielectric sheet in such a manner that the each plate of the inter-resonator coupling capacitor electrode connects to separate inductors. In addition, a second organic dielectric layer and a third organic dielectric layer sandwich the first organic dielectric layer, and comprise a high frequency hydrocarbon material with a thickness of 30–40 mils, which are disposed so as to sandwich said first dielectric sheets there between.

The bandpass filter 500 further comprises an additional dielectric layer, in this case solder mask, provided on an outermost one of the shield electrodes to protect the outermost shield electrodes. The inductors 512, 514 did not provide the needed capacitance in the desired length, and therefore each are connected to a separate grounded/shunted parallel plate using the same first organic layer as the sandwiched dielectric, which then together form the resonator pairs 560, 562, as illustrated. In the illustrated device, parallel plate capacitors 526, 528 are utilized on either side of the first and last resonator elements at the input and output terminals of the device for impedance matching purposes. If greater density is desired multiple thin layers such as the first dielectric layer can be used to form multi (>2) plate capacitors.

The bandpass filter 500 further comprise at two external ground shield electrodes 534 respectively formed on different side surfaces of a laminated body comprising said first through three or more dielectric layers and connected to said shield electrodes. Additionally these provide the connection for the shorted inductors/ resonators and capacitors. Moreover, the presence of these external electrodes makes it a CPW/stripline topology, where the reference is on the same first dielectric layer provides the shielding internally, and also provides for the ground connectivity to the resonators/inductors and capacitors.

The bandpass filter further comprises an external input terminal electrode 564 and an external output terminal electrode 566 which are formed on one side surface of a laminated body comprising said first through three or more dielectric sheets. External side wall shield electrodes 534 (FIG. 7) are provided between said external input and output terminal electrodes on the side surfaces of the laminated body and external ground shield electrodes 548 are provided on opposing top and bottom surfaces of the laminated body and are electrically connected to the side wall shield electrodes 534.

The patterning of the external ground shields electrodes 548 on the top and bottom surfaces is required for leaving space for the signal input output as shown in FIGS. 7 and 8.

In the organic bandpass filter 500, the first step to making connection between devices is done by drilling through holes as small as 2 mils with pads as big as three times the size of the via through LCP and copper. Both sides of LCP copper laminate are then metalized via electroless. The copper on both sides of laminate is then electroplated, and the copper layer is printed and etched to define filter component.

The second and third organic dielectric layers are Rogers 4350 from Rogers Corporation with a generally larger thickness than the first organic dielectric layer, such as approximately 35 mils, with copper metal (for high power applications) on both sides of filter to a given thickness to encapsulate components. All metals are electroplate and etched and patterned on top and bottom of the device to leave space for signal input and output.

The side wall grounded shield electrodes 534 can be obtained by single or multiple connected drilled plated through holes and then connected via electroless or sputter seeded copper in through hole. Electroplate copper in through hole and on surface. Print and etch copper to form SMD connection. The copper electrodes may be electroless NiAu plate to prevent excess oxidation.

Figure 9:
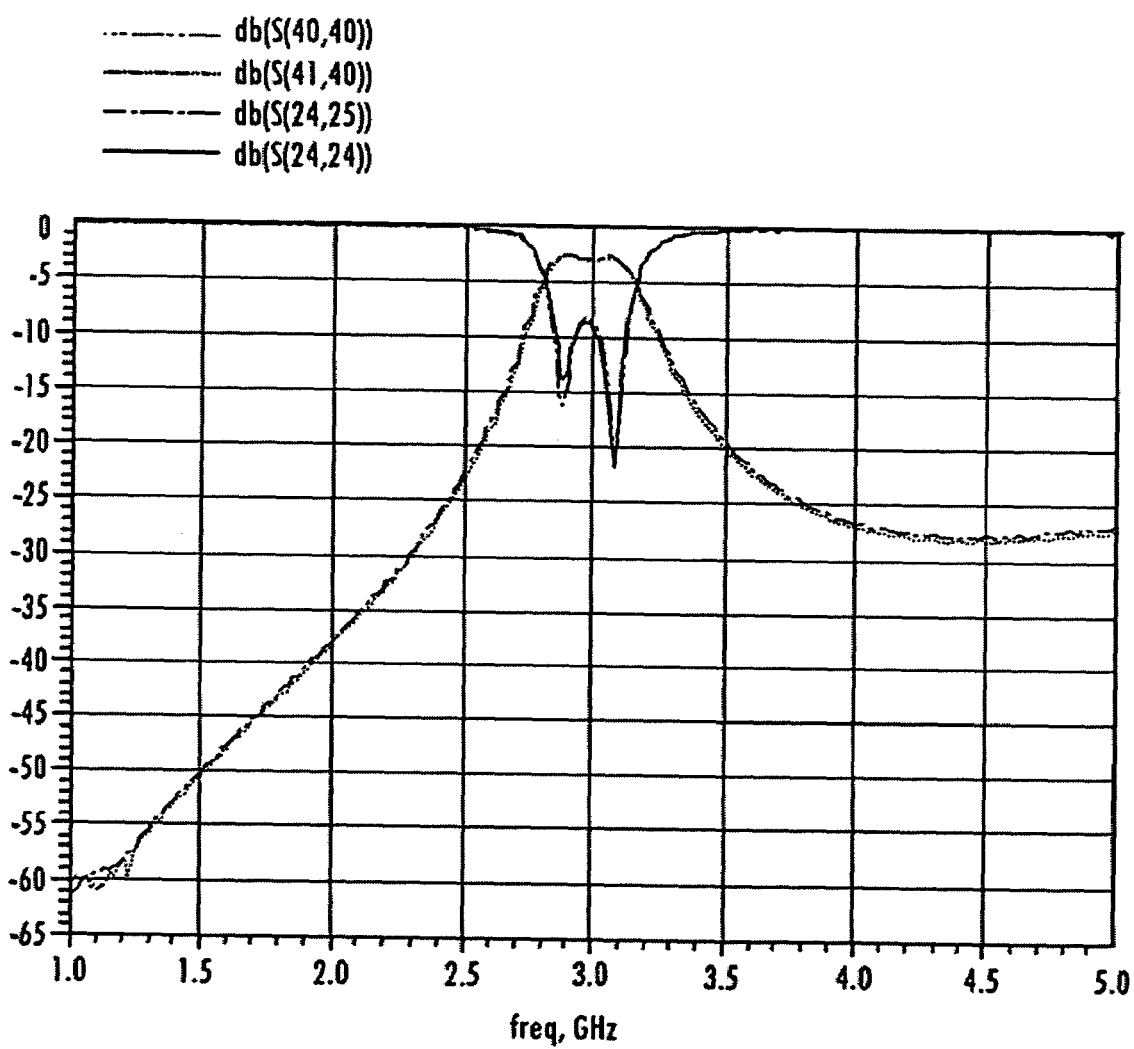
FIG. 9 is a graphical representation of a model to hardware correlation for the organic bandpass filter of FIG. 7.

FIG. 9 shows model to hardware correlation for the organic bandpass filter 500 in FIGS. 7 and 8. The filter was measured using an HP 8720ES Vector Network Analyzer after performing a SOLT calibration. The measured data for the fabricated filter and simulated data is shown. As evident from FIG. 9, there is excellent correlation between measured data and simulated data. The organic bandpass filter 500 was fabricated using LCP for the first organic dielectric layer, and shows an insertion loss of only 1.88 dB at 3 GHz and a 1 dB bandwidth of 200 MHz. Such a filter would be suitable for IF frequency use in fixed wireless type receivers where the carriers frequency of the incoming signal is approximately 14 GHz and has to be down-converted to several lower frequency signals.

The organic bandpass filter 500 utilizes a CPW/stripline topology with only two metallization levels and all embedded passives in an organic substrate, which resulted in better performance than non-standardized multilayer (>5) ceramic processes, as seen in FIG. 9.

It is worth noting that while the Q of the capacitors for filter 500 was measured as high as 200 at 3 GHz using LCP, the Q for the inductor was kept at the required level of approximately 100 at 3 GHz. This was done to understand the advantages of using a material such as LCP without optimizing the design for the inductors. However, Qs exceeding 200 are also attainable for inductors on organic substrates. A resimulation for the filter circuit shown, but with Qs of 200 for the inductors, showed an insertion loss of 1.15 dB when simulated. A filter with a loss of 1.15 dB at the frequency and bandwidth can be alternatively achieved only by using the bulkier and costlier ceramic cavity and monoblock filters.

EXAMPLE II

Figure 10:
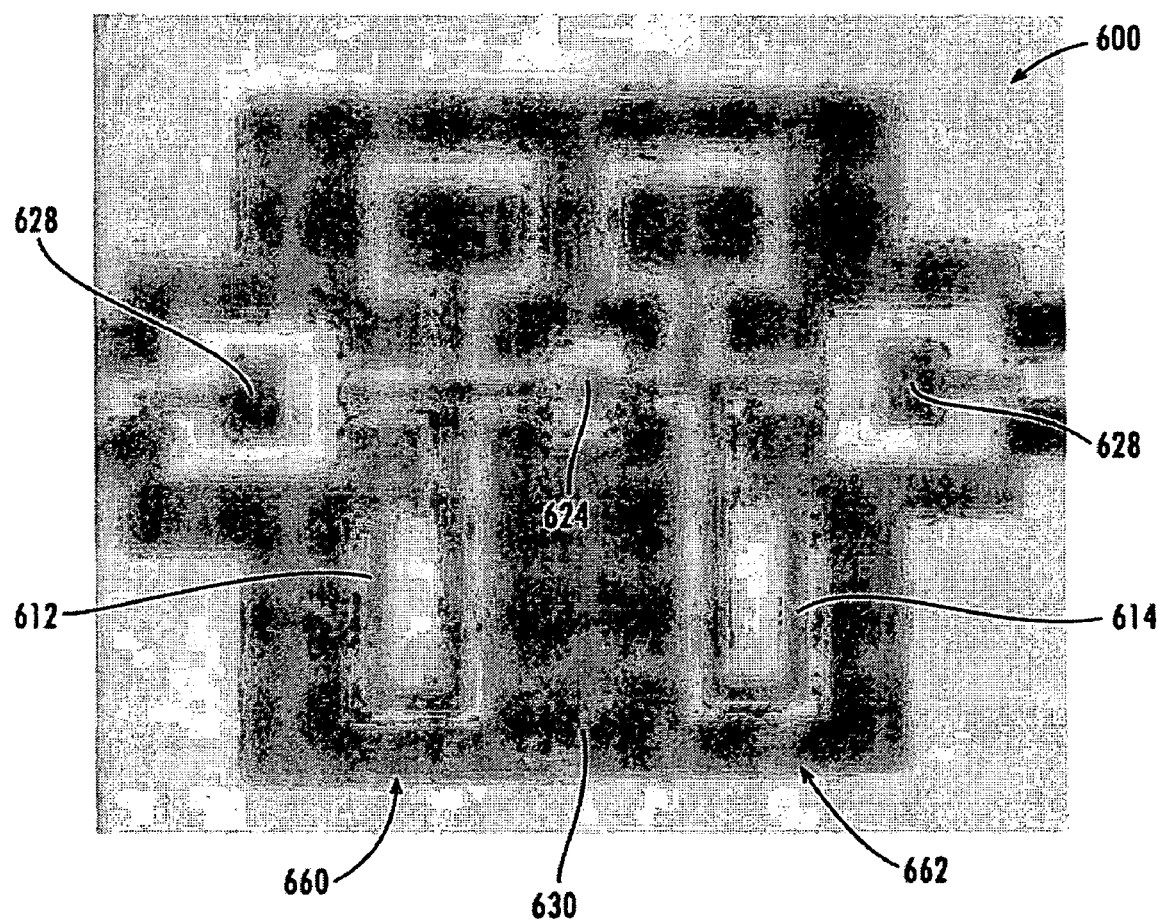
FIG. 10 is a picture from a top plan view of a BGA style organic filter, in accordance with an embodiment of the present invention.

Another organic bandpass filter 600 in accordance with an embodiment of the present invention is shown in the picture of FIG. 10. The filter 600 comprises shorted hybrid CPW-microstrip, meander inductors 612, 614 formed close to each other on a first organic dielectric layer, which is a layer of LCP, directly magnetically coupled to each other. The term "shorted" refers to one end of each inductor connected to the large metallic area, which in this case serves as the in-built shield 630 (also referred to as a coplanar ground ring). In addition, the filter 600 includes an inter-resonator parallel plate coupling capacitor electrode 624 with in-built shield 630 formed using two disconnected metal plates that sandwich the first organic dielectric layer in such a manner that the each plate of the inter-resonator coupling capacitor electrode connects to separate resonators. Yet further, the filter 600 includes a first shield electrode formed respectively on a second organic dielectric layer, which in this case is Rogers 4350 from Rogers Corporation, and which is disposed over the circuitry described above, so as to sandwich and substantially completely shield one surface of the filter.

The filter may further comprise a third organic dielectric sheet, if needed, provided on the outside of the shield electrode to protect the outermost shield electrode. In this filter, the inductors 612, 614 did not provide the needed capacitance in the desired length, and therefore each is connected to a separate grounded/shunted parallel plate (two plate) using the same first organic layer as the sandwiched dielectric, which then together form the resonator pairs. In addition, parallel plate/interdigital capacitors 626, 628 are utilized on either side of the first and last resonator elements at the input and output terminals of the device for impedance matching purposes. If greater density is desired, then multiple thin layers such as the first dielectric layer can be used to form multi (>2) plate capacitors. In addition, another dielectric layer such as lower temperature melt LCP compare to the higher melt temp LCP used as the first dielectric is laminated on the other side of the first substrate (not the same side as the second substrate), and then solder bump openings are made where ground and input output connections are required to connect the device to corresponding terminals on the board.

The CPW topology, where the reference is on the same first dielectric layer provides the shielding internally, provides for the ground connectivity to the resonators/inductors and capacitors. However in more noisy environments the external electrodes, such as those in Example I, could be added for added shielding.

In the second bandpass filter, the openings in the third substrate allow for the ground connection connected to the CPW ground and two other openings not connected to each other or the ground serving for input and output terminals.

The first step to making connection between devices is by drilling through holes (as small in diameters as the thickness of the dielectric used) through the first organic dielectric layer of LCP and copper. Then both sides of LCP copper laminate are metalized via electroless copper. Copper is then electroplated on both sides of laminate. The copper is then printed and etched to define filter component.

The second organic dielectric layer can be laminate LCP or another appropriate dielectric with generally larger thickness than the first organic dielectric layer with copper metal (for high power applications) plated on top of the filter to a given thickness of approximately 20–30 μm to encapsulate components. The third organic dielectric layer is laminate LCP or another appropriate dielectric with generally larger or smaller thickness than the first organic dielectric layer with copper plated in the openings to a given thickness to provide for solder landing pads. The openings in the third substrate are filled with screen solder paste and reflowed to form bumps.

Figure 11:
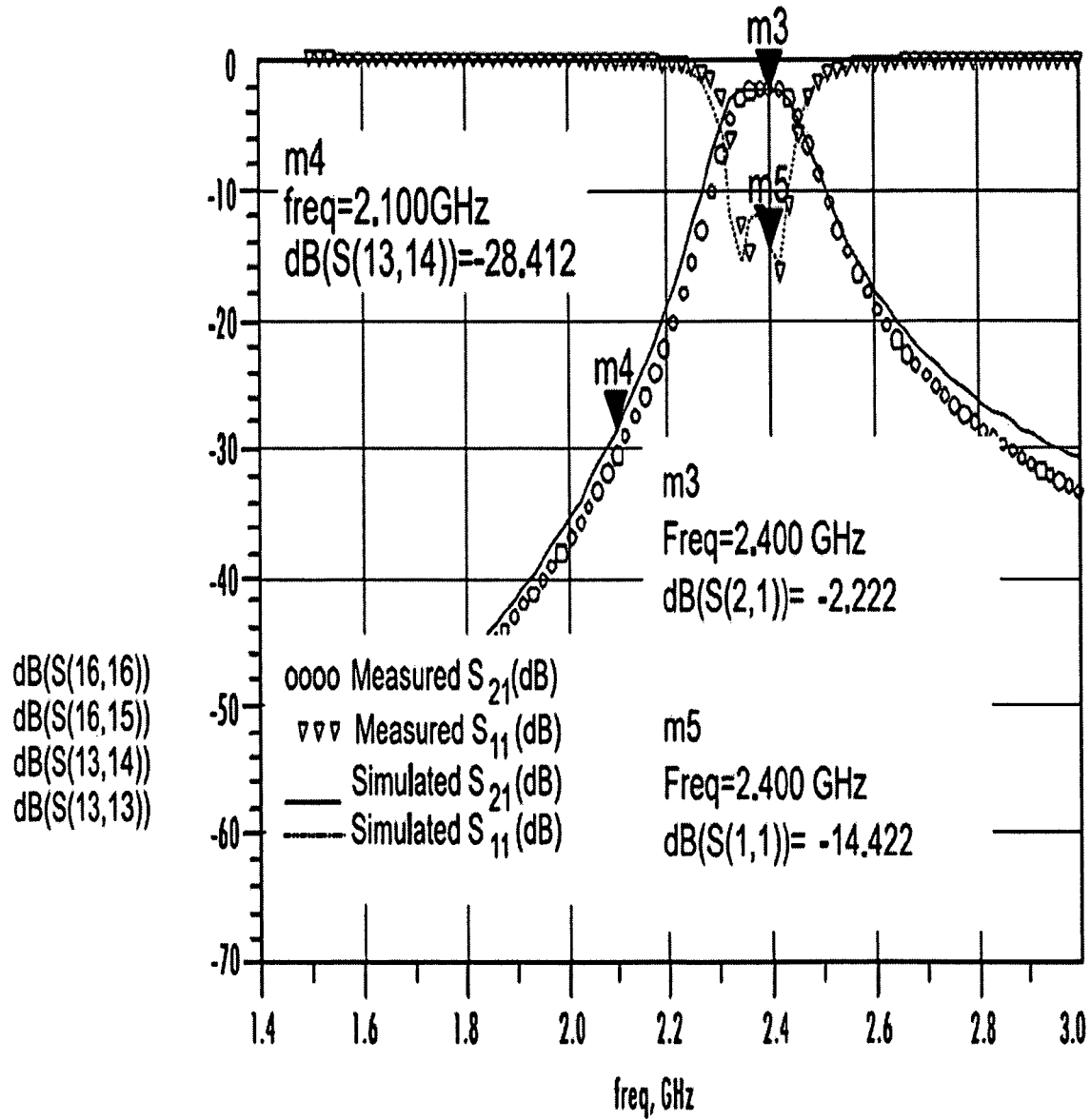
FIG. 11 is a graphical representation of measured and modeled data for the BGA style organic filter in FIG. 10.

FIG. 11 shows model to hardware correlation for the organic bandpass filter 600 in FIG. 10. In summary, the filter utilizes a CPW topology with only two metallization levels and all embedded passives in an organic substrate, which resulted in better performance than of non-standardized multilayer (>5) ceramic processes. As the adoption of lower loss materials, such as LCP, becomes more common, this design shows the feasibility of integrating very low loss filters for applications such as Bluetooth/WLAN in compact boards and packages.

The measured data for the filter 600 and simulated data is shown in FIG. 11. As seen there is excellent correlation between measured data and simulated data. The filter 600 has an insertion loss of only 2.22 dB.

It is worth noting that while the Q of capacitors may be as high as 300 using LCP, the Q for the inductor was kept at the required level of approximately 130. The insertion loss was 0.6 dB lower than the MLC filters with similar footprint. A resimulation for the filter circuit shown, but with Qs of 200 for the inductors, showed an insertion loss of 1.65 dB when simulated. A filter with a loss of 1.65 dB at the frequency and bandwidth desired of the Bluetooth/WLAN filter can be alternatively achieved only by using the bulkier and costlier ceramic cavity and monoblock filters.

EXAMPLE III

Figure 12:
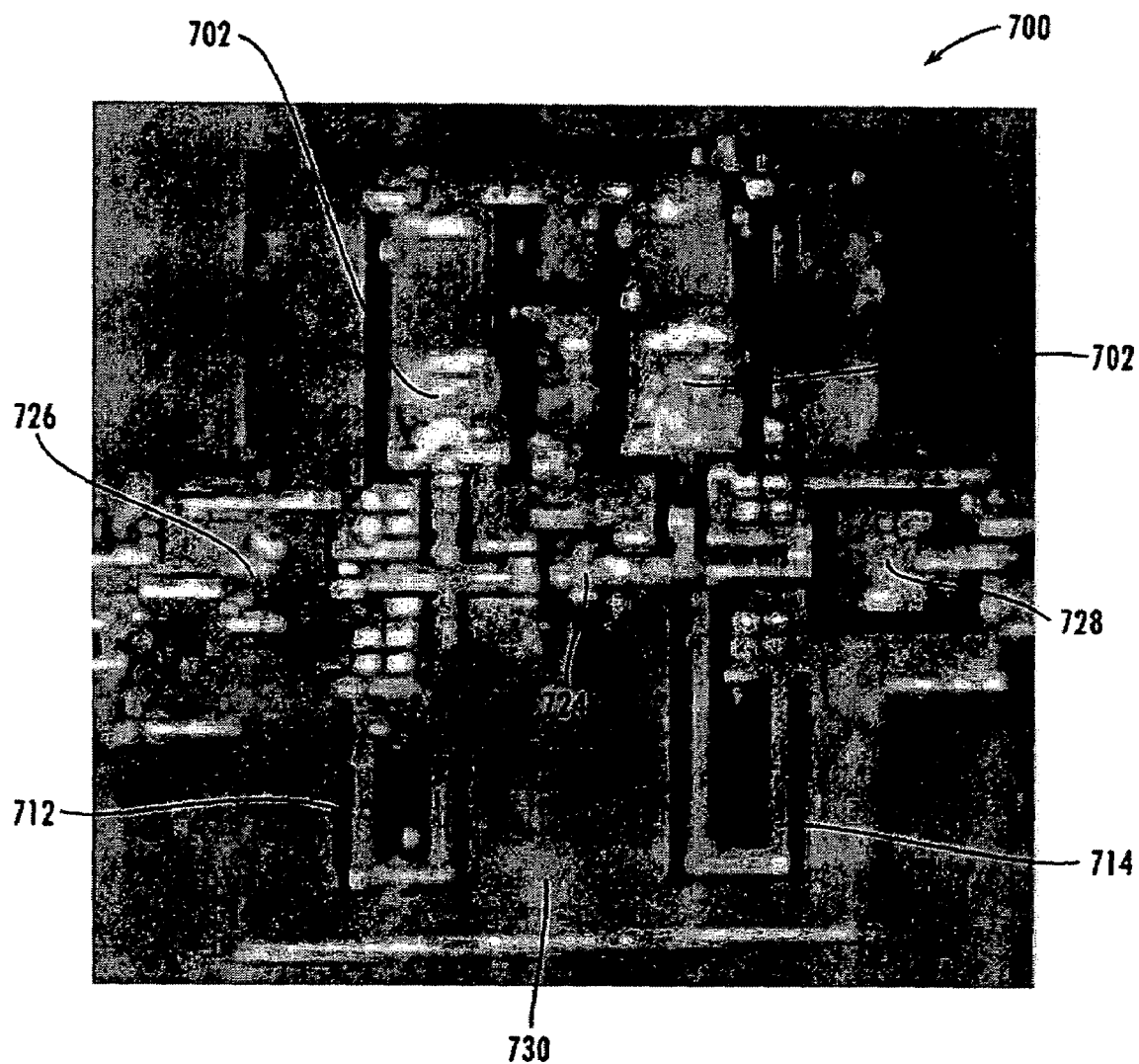
FIG. 12 is a picture from a top plan view of an organic dielectric filter that includes SMD capacitors in accordance with an embodiment of the present invention.

Yet another organic bandpass filter 700 in accordance with an embodiment of the present invention is shown in the picture of FIG. 12. The organic bandpass filter 700 comprises shorted hybrid CPW-microstrip meander inductors formed close to each other on a first organic dielectric substrate, such as epoxy based Vialux by E.I. du Pont de Nemours and Company, directly magnetically coupled to each other. In addition, the third bandpass filter comprises an inter-resonator parallel plate coupling capacitor electrode 724, with ground ring, formed using two disconnected metal plates that sandwich the same organic dielectric sheet in such a manner that the each plate of the inter-resonator coupling capacitor electrode connects to separate resonators.

The transmission line inductors 712, 714 did not provide the needed capacitance in the desired length. Since the dielectric is lossy for the capacitor application, each is replaced by a separate discrete capacitor 702, such as a chip capacitor or ceramic capacitor with one terminal of one capacitor connected to one resonator and the other shorted to the in-built shielding electrode 730. The same can be done for the other capacitor 724 where one terminal is grounded, i.e., connected to a CPW ground electrode 730 and the other terminal is connected to the resonator section. In addition, a parallel plate/interdigital capacitors 726, 728 are utilized on either side of the first and last resonator elements at the input and output terminals of the device for impedance matching purposes. If greater density is desired multiple thin layers such as the first dielectric layer can be used to form multi (>2) plate capacitors.

The organic bandpass filter 700 may further comprise another monoclad second organic dielectric layer that is laminated on the one side of the first organic dielectric layer (opposite the side of the discrete capacitors). In addition, it may further comprise multiple plate through holes going through first and second organic dielectric layer connected to the in-built shielding electrode 730 and metal sheet of the monoclad dielectric. This may or may not be desired for cost saving purposes, though adding these vias makes it a true CPW/microstrip hybrid device. The CPW topology, where the reference is on the same first organic dielectric layer, provides the shielding internally, and also provides for the ground connectivity to the resonators/inductors and capacitors. However in more noisy environments the external through holes can be added for added shielding.

The organic bandpass filter 700 may further comprise a third organic dielectric layer on the same side as the discrete capacitors 702 providing for protection of the circuits and seal the device from moisture uptake and corrosion. This material could be the same as solder mask materials, which would be used by the board manufacturers to protect other circuits on the board. In addition, the bandpass filter 700 may further comprise a metallic lid or cap/electromagnetic shield which encloses the device on the top surface and prevents EMI interference and radiation effects from affecting the performance of the filter.

Figure 13:
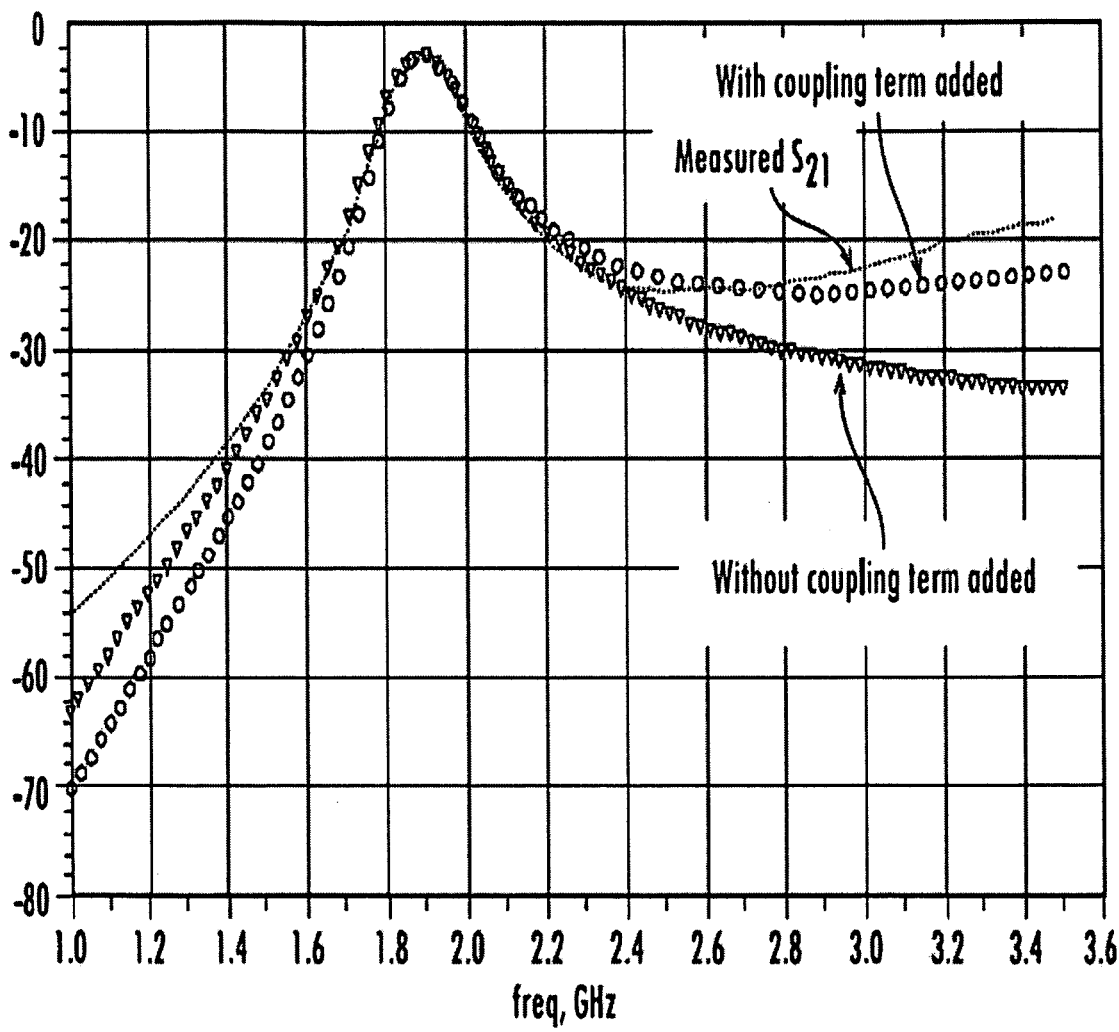
FIG. 13 is a graphical representation of a model to hardware correlation for the organic dielectric filter in FIG. 12.

FIG. 13 shows model to hardware correlation for the organic bandpass filter 700 in FIG. 12. In particular, FIG. 13 shows a model to hardware correlation for the filter with all embedded components, except the two discrete capacitors. As shown, there is very good agreement between measured and predicted results. The measured filter has a center frequency=1.9 GHz, a 1 dB passband of 60 MHz, and a 3 dB bandwidth of 120 MHz. The attenuation at 1.5 GHz is ~40 dB, as desired. The insertion loss is approximately 3.8 dB at 1.9 GHz, which is greater than the specification of 3 dB for such applications. This is due to the use of center and matching capacitors with Qs of 40 in Vialux rather than the required Q of 60 needed to achieve a lesser loss of 3 dB. This insertion loss can be lowered by using A-PPE™ or LCP™ from Rogers Corporation dielectric materials for the organic dielectric layer. Such a filter would be applicable in cellular phones as the intermediate RF filter or in cordless phones as the front-end RF filter.

As seen in FIG. 13, there is a discrepancy in the measured and predicted results beyond 2.5 GHz for $S_{21}$. This discrepancy is due to the coupling between the two discrete capacitors. The simulations were done for individual components and for optimizing the spacing between the inductors. The discrete capacitors were measured as individual components without any coupling between them. The tight spacing between the capacitors could have resulted in unwanted coupling effects which show up at frequencies greater than 2.5 GHz. After including a mutual coupling term between the two discrete capacitors, the results show better agreement with measurements.

In summary, the organic bandpass filter 700 utilizes a CPW topology with only two metallization levels and an epoxy based substrate along with discrete capacitors, which achieves the performance of non-standardized multilayer (>5) ceramic processes. Additionally, the MLC filters cannot be integrated with other components in the same layers of the ceramic package due to several reasons, a few of which include: firstly, because of the use of a filter-specific dielectric which is incompatible with other dielectrics; secondly, because of the specificity of certain attributes such as 100 µm thick aluminium conductor lines required to lower the attenuation present due to standard 5 µm lines used in ceramic processes. The design discussed in this section was fabricated using standard design rules pertinent to multilayer laminate boards and can be directly implemented on the board without the need for a separate surface mount device. Furthermore, the model to hardware correlation shows validity of the design tecchnique used.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. An organic bandpass filter, comprising:
    a first core layer having an upper surface and a lower surface;
    a second core layer having an upper surface and a lower surface, wherein the first core layer and the second core layer are positioned opposite one another so that the lower surface of the first core layer is facing the upper surface of the second core layer;
    an organic dielectric layer having an upper conductive layer and a lower conductive layer that are patterned to form at least two resonators, wherein two of the resonators are internally coupled to each other, the organic dielectric layer being arranged between the first core layer and the second core layer;
    a first shield electrode on the upper surface of the first core layer opposite the organic dielectric layer;
    a second shield electrode on the lower surface of the second core layer opposite the organic dielectric layer; and
    a side shield electrode in electrical contact with the first and second shield electrodes, wherein the side shield electrode comprises an in-built shielding formed of a portion of the upper conductive layer, wherein the in-built shielding is co-planar with and surrounds at least a portion of the resonators.

2. The bandpass filter of claim 1, wherein the resonators are coupled magnetically, electrically or a combination thereof.

3. The bandpass filter of claim 1, wherein the resonators comprise a combination of transmission lines, inductors and capacitors.

4. The bandpass filter of claim 1, wherein the resonators are formed by transmission line.

5. The bandpass filter of claim 1, wherein the resonators are formed by inductors.

6. The bandpass filter of claim 1, wherein each of the resonators comprises an inductor connected to a parallel plate capacitor, wherein the capacitors include disconnected plates sandwiching the organic dielectric layer.

7. The bandpass filter of claim 1, further comprising an external input terminal electrode and an external output terminal electrode formed on opposite side surfaces of the filter, and the side shield electrode being disposed on other opposite sides of the filter.

8. The bandpass filter of claim 7, wherein the organic dielectric layer includes a circuit matching device connected to the external input terminal electrode and a second circuit matching device connected to the external output terminal electrode, wherein the first and second circuit matching devices are selected from the group consisting of a capacitor, inductor, transmission line and a combination thereof.

9. The bandpass filter of claim 1, wherein both the first and second core layers include a bondply layer.

10. The bandpass filter of claim 1, wherein the organic dielectric layer comprises multiple layers of organic material, and wherein at least a portion of a passive device is formed on each respective layer of the multiple layers of organic material.

11. The bandpass filter of claim 1, further comprising a first protective layer formed on the first shield electrode and a second protective layer formed on the second shield electrode.

12. The bandpass filter of claim 1, wherein the side shield electrode comprises a third shield electrode and fourth shield electrode formed on opposite side surfaces of the filter.

13. The bandpass filter of claim 1, wherein at least one resonator includes a capacitor, and the capacitor includes a first plate formed on the upper conductive layer and a corresponding ground plate formed on the lower conductive layer, and wherein the in-built shielding is disposed on the upper conductive layer in proximity of the first plate and is electrically connected to the ground plate by vias in the organic dielectric layer.

14. The bandpass filter of claim 1, further comprising an additional resonator formed by one of an inductor, transmission line, capacitor or a combination thereof.

15. The bandpass filter of claim 1, further comprising a plurality of poles formed by one of an inductor, transmission line, capacitor or a combination thereof.

16. An organic bandpass filter, comprising:
    a protective layer having an upper surface and a lower surface;
    a core layer having an upper surface and a lower surface, wherein the core layer and the protective layer are position opposite one another so that the lower surface of the protective layer is facing the upper surface of the core layer;
    an organic dielectric layer having an upper conductive layer and a lower conductive layer that are patterned to form at least two resonators, wherein two of the resonators are internally coupled to each other, the organic dielectric layer being arranged between the core layer and the protective layer;
    a first shield electrode on the lower surface of the core layer opposite the organic dielectric layer;
    a side shield electrode in electrical contact with the first shield electrode, wherein the side shield electrode comprises an in-built shielding formed of a portion of the upper conductive layer, wherein the in-built shielding is co-planar with and surrounds at least a portion of the resonators;
    a plurality of solder balls on the protective layer; and
    through holes that electrically connect at least one solder ball to the first shield electrode.

17. The bandpass filter of claim 16, wherein the resonators are coupled magnetically, electrically or a combination thereof.

18. The bandpass filter of claim 16, wherein the resonators comprise a combination of transmission lines, inductors and capacitors.

19. The bandpass filter of claim 16, wherein the resonators are formed by transmission line.

20. The bandpass filter of claim 16, wherein the resonators are formed by inductors.

21. The bandpass filter of claim 16, wherein each of the resonators comprises an inductor connected to a parallel plate capacitor, wherein the capacitors include disconnected plates sandwiching the organic dielectric layer.

22. The bandpass filter of claim 16, further comprising an external input terminal electrode and an external output terminal electrode formed on the protective layer, wherein the terminal electrodes are connected to separate solder balls.

23. The bandpass filter of claim 22, wherein the organic dielectric layer includes a circuit matching device connected to the external input terminal electrode and a second circuit matching device connected to the external output terminal electrode, wherein the first and second circuit matching devices are selected from the group consisting of a capacitor, inductor, transmission line and a combination thereof.

24. The bandpass filter of claim 16, wherein the core layers include a bondply layer.

25. The bandpass filter of claim 16, wherein the organic dielectric layer comprises multiple layers of organic material, and wherein at least a portion of a passive device is formed on each respective layer of the multiple layers of organic material.

26. The bandpass filter of claim 16, wherein the protective layer comprises an organic material.

27. The bandpass filter of claim 16, wherein the side shield electrode comprises a second shield electrode and third shield electrode formed on opposite side surfaces of the filter.

28. The bandpass filter of claim 16, wherein at least one resonator includes a capacitor, and the capacitor includes a first plate formed on the upper conductive layer and a corresponding ground plate formed on the lower conductive layer and wherein the in-built shielding is disposed on the upper conductive layer in proximity of the first plate and is electrically connected to the ground plate by vias in the organic dielectric layer.

29. The bandpass filter of claim 16, further comprising an additional resonator formed by one of an inductor, transmission line, capacitor or a combination thereof.

30. The bandpass filter of claim 16, further comprising a plurality of poles formed by one of an inductor, transmission line, capacitor or a combination thereof.

31. A stand-alone organic passive device, comprising:
a first core layer having an upper surface and a lower surface;
a second core layer having an upper surface and a lower surface, wherein the first core layer and the second core layer are position opposite one another so that the lower surface of the first core layer is facing the upper surface of the second core layer;
an organic dielectric layer having an upper conductive layer and a lower conductive layer that is patterned to form at least one passive device, the organic dielectric layer being arranged between the first core layer and the second core layer;
a first shield electrode on the upper surface of the first core layer opposite the organic dielectric layer;
a second shield electrode on the lower surface of the second core layer opposite the organic dielectric layer; and
a side shield electrode in electrical contact with the first and second shield electrodes, wherein the side shield electrode comprises an in-built shielding formed of a portion of the upper conductive layer, wherein the in-built shielding is co-planar with and surrounds at least a portion of the at least one passive device.

32. A stand-alone organic passive device, comprising:
a protective layer having an upper surface and a lower surface;
a core layer having an upper surface and a lower surface, wherein the core layer and the protective layer are position opposite one another so that the lower surface of the protective layer is facing the upper surface of the core layer;
an organic dielectric layer having an upper conductive layer and a lower conductive layer that is patterned to form at least one passive device, the organic dielectric layer being arranged between the core layer and the protective layer;
a first shield electrode on the lower surface of the core layer opposite the organic dielectric layer;
a side shield electrode in electrical contact with the first shield electrode;
a plurality of solder balls on the protective layer; and
through holes that electrically connect at least one solder ball to the first shield electrode, wherein the side shield electrode comprises an in-built shielding formed of a portion of the upper conductive layer, wherein the in-built shielding is co-planar with and surrounds at least a portion of the at least one passive device.

\* \* \* \* \*